United States Patent
Sen et al.

(10) Patent No.: US 9,617,151 B2
(45) Date of Patent: Apr. 11, 2017

(54) METHODS FOR CONTROLLING DENSITY, POROSITY, AND/OR GAP SIZE WITHIN NANOTUBE FABRIC LAYERS AND FILMS

(75) Inventors: Rahul Sen, Lexington, MA (US); J. Thomas Kocab, Exeter, RI (US); Feng Gu, Ellicot City, MD (US)

(73) Assignee: Nantero Inc., Woburn, MA (US)

( * ) Notice: Subject to any disclaimer, the term of this patent is extended or adjusted under 35 U.S.C. 154(b) by 516 days.

(21) Appl. No.: 13/578,691

(22) PCT Filed: Feb. 14, 2011

(86) PCT No.: PCT/US2011/024710
§ 371 (c)(1),
(2), (4) Date: Oct. 31, 2012

(87) PCT Pub. No.: WO2011/100661
PCT Pub. Date: Aug. 18, 2011

(65) Prior Publication Data
US 2013/0052449 A1  Feb. 28, 2013

Related U.S. Application Data

(60) Provisional application No. 61/304,045, filed on Feb. 12, 2010.

(51) Int. Cl.
*C01B 31/02* (2006.01)
*H01B 1/04* (2006.01)
(Continued)

(52) U.S. Cl.
CPC ............ *B82Y 30/00* (2013.01); *G11C 13/025* (2013.01); *Y10T 428/249921* (2015.04)

(58) Field of Classification Search
CPC .......... B82Y 30/00; B82Y 40/00; H01B 1/04; C01B 31/02; H01L 51/0003; H01L 51/0048
(Continued)

(56) References Cited

U.S. PATENT DOCUMENTS

| 6,057,637 A | 5/2000 | Zettl |
| 6,187,823 B1 | 2/2001 | Haddon et al. |
| (Continued) | | |

FOREIGN PATENT DOCUMENTS

| EP | 0947466 | 6/1999 |
| EP | 1061040 | 12/2000 |
| (Continued) | | |

OTHER PUBLICATIONS

Niyogi et al. ("Selective Aggregation of Single-Walled Carbon Nanotubes via Salt Addition." JACS, 129, pp. 1898-1899, web Jan. 25, 2007).*
(Continued)

*Primary Examiner* — Tri V Nguyen
(74) *Attorney, Agent, or Firm* — Nantero Inc.

(57) ABSTRACT

A method for controlling density, porosity and/or gap size within a nanotube fabric layer is disclosed. In one aspect, this can be accomplished by controlling the degree of rafting in a nanotube fabric. In one aspect, the method includes adjusting the concentration of individual nanotube elements dispersed in a nanotube application solution. A high concentration of individual nanotube elements will tend to promote rafting in a nanotube fabric layer formed using such a nanotube application solution, whereas a lower concentration will tend to discourage rafting. In another aspect, the method includes adjusting the concentration of ionic particles dispersed in a nanotube application solution. A low concentration of ionic particles will tend to promote rafting in a nanotube fabric layer formed using such a nanotube application solution, whereas a higher concentration will tend to discourage rafting. In other aspects, both concentration parameters are adjusted.

13 Claims, 36 Drawing Sheets

(51) Int. Cl.
  *B82Y 40/00* (2011.01)
  *B82Y 30/00* (2011.01)
  *G11C 13/02* (2006.01)

(58) Field of Classification Search
  USPC .............. 252/500–506, 510, 182.32, 182.34;
  423/445 R–447.1, 460; 977/842, 845,
  977/847
  See application file for complete search history.

(56) References Cited

U.S. PATENT DOCUMENTS

| | | | |
|---|---|---|---|
| 6,277,318 | B1 | 8/2001 | Bower |
| 6,331,262 | B1 | 12/2001 | Haddon et al. |
| 6,342,276 | B1 | 1/2002 | You |
| 6,368,569 | B1 | 4/2002 | Haddon et al. |
| 6,409,567 | B1 | 6/2002 | Amey, Jr. et al. |
| 6,423,583 | B1 | 7/2002 | Avouris et al. |
| 6,495,116 | B1 | 12/2002 | Herman |
| 6,495,258 | B1 | 12/2002 | Chen et al. |
| 6,515,339 | B2 | 2/2003 | Shin et al. |
| 6,528,020 | B1 | 3/2003 | Dai et al. |
| 6,531,513 | B2 | 3/2003 | Haddon et al. |
| 6,630,772 | B1 | 10/2003 | Bower et al. |
| 6,641,793 | B2 | 11/2003 | Haddon et al. |
| 6,645,628 | B2 | 11/2003 | Shiffler, Jr. et al. |
| 6,706,402 | B2 | 3/2004 | Rueckes et al. |
| 6,707,098 | B2 | 3/2004 | Hofmann et al. |
| 6,752,977 | B2 | 6/2004 | Smalley et al. |
| 6,808,746 | B1 | 10/2004 | Dai et al. |
| 6,833,558 | B2 | 12/2004 | Lee et al. |
| 6,835,591 | B2 | 12/2004 | Rueckes et al. |
| 6,858,197 | B1 | 2/2005 | Delzeit |
| 6,863,942 | B2 | 3/2005 | Ren et al. |
| 6,888,773 | B2 | 5/2005 | Morimoto |
| 6,890,780 | B2 | 5/2005 | Lee |
| 6,896,864 | B2 | 5/2005 | Clarke |
| 6,899,945 | B2 | 5/2005 | Smalley et al. |
| 6,905,892 | B2 | 6/2005 | Esmark |
| 6,918,284 | B2 | 7/2005 | Snow et al. |
| 6,919,592 | B2 | 7/2005 | Segal et al. |
| 6,919,740 | B2 | 7/2005 | Snider |
| 6,921,575 | B2 | 7/2005 | Horiuchi et al. |
| 6,924,538 | B2 | 8/2005 | Jaiprakash et al. |
| 6,946,410 | B2 | 9/2005 | French et al. |
| 6,998,452 | B1 | 2/2006 | Parker |
| 7,057,402 | B2 | 6/2006 | Cole et al. |
| 7,115,864 | B2 | 10/2006 | Colbert et al. |
| 7,259,410 | B2 | 8/2007 | Jaiprakash et al. |
| 7,335,395 | B2 | 2/2008 | Ward et al. |
| 7,365,632 | B2 | 4/2008 | Bertin et al. |
| 7,375,369 | B2 | 5/2008 | Sen et al. |
| 2001/0004979 | A1 | 6/2001 | Han et al. |
| 2002/0081380 | A1 | 6/2002 | Dillon et al. |
| 2002/0160111 | A1 | 10/2002 | Sun et al. |
| 2003/0004058 | A1 | 1/2003 | Li et al. |
| 2003/0012723 | A1* | 1/2003 | Clarke ............................ 423/460 |
| 2003/0012951 | A1 | 1/2003 | Clarke et al. |
| 2003/0065206 | A1 | 4/2003 | Bolskar et al. |
| 2003/0122111 | A1 | 7/2003 | Glatkowski |
| 2003/0170167 | A1* | 9/2003 | Nikolaev et al. ........... 423/447.1 |
| 2003/0177450 | A1 | 9/2003 | Nugent |
| 2003/0185741 | A1 | 10/2003 | Matyjaszewski |
| 2003/0200521 | A1 | 10/2003 | DeHon et al. |
| 2003/0220518 | A1 | 11/2003 | Bolskar et al. |
| 2004/0005723 | A1 | 1/2004 | Empedocles et al. |
| 2004/0007528 | A1 | 1/2004 | Bakajin et al. |
| 2004/0023253 | A1 | 2/2004 | Kunwar et al. |
| 2004/0031975 | A1 | 2/2004 | Kern et al. |
| 2004/0034177 | A1 | 2/2004 | Chen |
| 2004/0041154 | A1 | 3/2004 | Watanabe et al. |
| 2004/0043527 | A1 | 3/2004 | Bradley et al. |
| 2004/0071949 | A1 | 4/2004 | Glatkowski et al. |
| 2004/0099438 | A1 | 5/2004 | Arthur et al. |
| 2004/0104129 | A1 | 6/2004 | Gu et al. |
| 2004/0132070 | A1 | 7/2004 | Star et al. |
| 2004/0181630 | A1 | 9/2004 | Jaiprakash et al. |
| 2004/0253167 | A1 | 12/2004 | Silva et al. |
| 2004/0265550 | A1 | 12/2004 | Glatkowski et al. |
| 2004/0266106 | A1 | 12/2004 | Lee |
| 2005/0053525 | A1 | 3/2005 | Segal et al. |
| 2005/0058797 | A1 | 3/2005 | Sen et al. |
| 2005/0065741 | A1 | 3/2005 | Segal et al. |
| 2005/0095938 | A1 | 5/2005 | Rosenberger et al. |
| 2005/0212014 | A1 | 9/2005 | Horibe et al. |
| 2005/0269554 | A1 | 12/2005 | Sen et al. |
| 2006/0052509 | A1 | 3/2006 | Saitoh |
| 2006/0204427 | A1 | 9/2006 | Ghenciu et al. |
| 2006/0237537 | A1 | 10/2006 | Empedocles |
| 2007/0004191 | A1 | 1/2007 | Gu et al. |
| 2008/0069759 | A1* | 3/2008 | Richter .................. B82Y 30/00 423/447.1 |
| 2008/0076837 | A1* | 3/2008 | Kuper et al. ..................... 516/32 |

FOREIGN PATENT DOCUMENTS

| | | | |
|---|---|---|---|
| GB | 2364933 | 2/2002 | |
| JP | 11008690 | 1/1999 | |
| JP | 11210336 | 7/1999 | |
| JP | 2002258885 | 4/2002 | |
| KR | 100827649 B1 * | 5/2008 | .............. B82B 3/00 |
| KR | 10-2008-0098664 | 11/2008 | |
| WO | WO-98/39250 | 9/1998 | |
| WO | WO-99/65821 | 12/1999 | |
| WO | WO-00/17101 | 3/2000 | |
| WO | WO-01/03208 | 1/2001 | |
| WO | WO-02/45113 | 6/2002 | |
| WO | WO-02/48701 | 6/2002 | |
| WO | WO-02/060812 | 8/2002 | |
| WO | WO-03/016901 | 2/2003 | |
| WO | WO-03/022733 | 3/2003 | |
| WO | WO-03/034142 | 4/2003 | |
| WO | WO-03/091486 | 11/2003 | |
| WO | WO-2004/039893 | 5/2004 | |
| WO | WO-2004/065655 | 8/2004 | |
| WO | WO-2004/065657 | 8/2004 | |
| WO | WO-2004/065671 | 8/2004 | |
| WO | WO-2006/065937 | 6/2006 | |
| WO | WO-2006/078293 | 7/2006 | |
| WO | WO-2011/050331 | 4/2011 | |

OTHER PUBLICATIONS

Ago, et al., "Workfunction of Purified and Oxidized Carbon Nanotubes," Synthetic Metals, vol. 103, 1999, pp. 2494-2495.

Ajayan, et al., "Applications of Carbon Nanotubes," Topics Appl. Phys., vol. 80, 2001, pp. 391-425.

Amblard, G., "Development and characterization of carbon nanotube processes for NRAM technology," Proc. of SPIE 2011, vol. 7970, pp. 797017-1-797017-7.

Ausman, et al., "Organic Solvent Dispersions of Single-Walled Carbon Nanotubes: Toward Solutions of Pristine Nanotubes," J. Phys. Chem. B, 2000, vol. 104, No. 38, pp. 8911-8915.

Awano, Y., "Graphene for VLSI: FET and Interconnect Applications," IEDM 2009 Technical Digest, pp. 10.1.1-10.1.4.

Bahr, et al., "Dissolution of Small Diameter Single-Wall Carbon Nanotubes in Organic Solvents," Chem. Commun., 2001, pp. 193-194.

Banerjee, et al., "Functionalization of Carbon Nanotubes with a Metal-Containing Molecular Complex," Nano Letters, vol. 2, No. 1, 2002, pp. 49-53.

Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.

Bonard, et al., "Monodisperse Multiwall Carbon Nanotubes Obtained with Ferritin as Catalyst," Nano Letters, vol. 2, No. 6, 2002, pp. 665-667.

Brock, et al., "Carbon Nanotube Memories and Fabrics in a Radiation Hard Semiconductor Foundry," 2005 IEEE Conference, 9 pgs.

(56) References Cited

OTHER PUBLICATIONS

Brown, K. M., "System in package "The Rebirth of SIP"," 2004 IEEE Custom Integrated Circuits, May 2004, 6 pgs.
Cassell, et al., "Large Scale CVD Synthesis of Single-Walled Carbon Nanotubes," J. Phys. Chem. B, vol. 103, 1999, pp. 6484-6492.
Chen, et al., "Dissolution of Full-Length Single-Walled Carbon Nanotubes," J. Phys. Chem. B, 2001, vol. 105, pp. 2525-2528.
Chen, et al., "Heterogeneous Single-Walled Carbon Nanotube Catalyst Discovery and Optimization," Chem. Mater., vol. 14, 2002, pp. 1891-1896.
Chen, et al., "Solution Properties of Single-Walled Carbon Nanotubes," Science, 1998, pp. 95-98.
Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Chiang, et al., "Purification and Characterization of Single-Wall Carbon Nanotubes (SWNTs) Obtained from the Gas-Phase Decomposition of CO (HiPco Process)," J. Phys. Chem. B, 2001, vol. 105, pp. 8297-8301.
Chiang, et al., "Purification and Characterization of Single-Wall Carbon Nanotubes," J. Phys. Chem. B, 2001, vol. 105, pp. 1157-1161.
Colomer, et al., "Different Purification Methods of Carbon Nanotubes Produced by Catalytic Synthesis," Synthesis Metals, 1999, vol. 103, pp. 2482-2483.
Crowley, et al., "512 Mb PROM with 8 layers of antifuse/Diode cells," IEEE International Solid-State Circuits Conference, vol. XLVI, Feb. 2003, pp. 284-285.
Cui, et al., "Carbon Nanotube Memory Devices of High Charge," Applied Phys. Ltrs., vol. 81, No. 17, Oct. 2002, pp. 3260-3262.
Dai, et al., "Controlled Chemical Routes to Nanotube Architectures, Physics, and Devices," J. Phys. Chem. B, vol. 103, 1999, pp. 11246-11255.
Delzeit, et al., "Multilayered Metal Catalysts for Controlling the Density of Single-Walled Carbon Nanotube Growth," Chem. Phys. Ltrs., vol. 348, 2001, pp. 368-374.
Desai, et al., "Freestanding Carbon Nanotube Specimen Fabrication," Proceeding 2005 5$^{th}$ IEEE Conference on Nanotechnology, Nagoya, Japan, Jul. 2005, 4 pgs.
Dillon, et al., "A Simple and Complete Purification of Single-Walled Carbon Nanotube Materials," Adv. Mater., 1999, vol. 11, No. 16, pp. 1354-1358.
Franklin, et al., "An Enhanced CVD Approach to Extensive Nanotube Networks with Directionality," Adv. Mater., vol. 12, No. 12, 2000, pp. 890-894.
Fuhrer, et al., "High-Mobility Nanotube Transistor Memory," Nano Letters, vol. 2, No. 7, 2002, pp. 755-759.
Georgakilas, et al., "Organic Functionalization of Carbon Nanotubes," J. Am. Chem. Soc., 2002, vol. 124, No. 5, pp. 760-761.
Gromov, "Purification of Carbon Nanotubes," Caramel Workshop, Jan. 23, 2002, 13 pgs.
Haddon, et al., "Purification and Separation of Carbon Nanotubes," MRS Bulletin, Apr. 2004, pp. 252-259 (www.mrs.org/publications/bulletins).
Hafner, et al., "Catalytic Growth of Single-Wall Carbon Nanotubes from Metal Particles," Chem. Phys. Ltrs., vol. 296, 1998, pp. 195-202.
Hirsch, A., "Functionalization of Single-Walled Carbon Nanotubes," Angew Chem. Int. Ed., 2002, vol. 41, No. 11, pp. 1853-1859.
Homma, et al., "Single-Walled Carbon Nanotube Growth on Silicon Substrates Using Nanoparticle Catalysts," JPN, J. Appl. Phys., vol. 41, 2002, pp. L89-L91.
Hou, et al., "Multi-Step Purification of Carbon Nanotubes," Carbon, 2002, vol. 40, pp. 81-85.
Huai, Y., "Spin-Transfet Torque MRAM (STT-MTAM): Challenges and Prospects," AAPS Bulletin, vol. 18, No. 6, Dec. 2008, pp. 33-40.

International Search Report, International Patent Application No. PCT/US05/18467 dated Oct. 1, 2007, 5 pgs.
International Search Report, International Patent Application No. PCT/US05/18539 dated Sep. 18, 2006, 4 pgs.
International Search Report, International Patent Application No. PCT/US05/18465 dated Aug. 21, 2006, 3 pgs.
International Search Report, International Patent Application No. PCT/US05/45316 dated Sep. 6, 2005, 2 pgs.
International Search Report, International Patent Application No. PCT/US11/024710 dated May 11, 2011, 2 pgs.
Islam, et al., "High Weight Fraction Surfactant Solubilization of Single-Wall Carbon Nanotubes in Water," Nano Letters, 2003, vol. 3, No. 2, pp. 269-273.
Jeong, et al., "A Purification Method of Single-Wall Carbon Nanotubes Using H2S and O2 Mixture Gas," Chem. Phys. Ltrs., vol. 344, Aug. 2001, pp. 18-22.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Johnson, R. Colin, "IBM Grown Nanotube Patterns on Silicon Wafers," EE Times, Sep. 2002, 1 pg.
Joselevich, et al., "Vectorial Growth of Metallic and Semiconducting Single-Wall Carbon Nanotubes," Nano Letters, vol. 0, No. 0, A-E, 2002.
Kahn, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Li, et al., "Carbon Nanotube Nanoelectrode Array for Ultrasensitive DNA Detection," Nano Letters, vol. 3, No. 5, 2003, pp. 597-602.
Li, et al., "Growth of Single-Walled Carbon Nanotubes from Discrete Catalytic Nanoparticles of Various Sizes," J. Phys. Chem. B, vol. 105, 2001, pp. 11424-11431.
Li, et al., "Preparation of Monodispersed Fe—Mo Nanoparticles as the Catalyst for CVD Synthesis of Carbon Nanotubes," Chem. Mater., vol. 13, 2001, pp. 1008-1014.
Martinez, et al., "Modifications of Single-Wall Carbon Nanotubes upon Oxidative Purification Treatments," http://www.iop.org/EJ/abstract/0957-4484/14/7/301. Printed May 20, 2004.
Matarredona, "Dispersion of Single-Walled Carbon Nanotubes in Aqueous Solutions of the Anionic Surfactant," J. Phys. Chem., 2003, vol. 107, pp. 13357-13367.
Mickelson, et al., "Solvation as Fluorinated Single-Wall Carbon Nanotubes in Alcohol Solvents," J. Phys. Chem. B, 1999, vol. 103, pp. 4318-4322.
Moore, et al., "Individually Suspended Single-Walled Carbon Nanotubes in Various Surfactants," Nano Letters, 2003, pp. 1379-1382.
"Multifunctional Nanotube Composites," http://www.ornl.gov/-odg/compositesmain.html. Printed May 20, 2004, 5 pgs.
Murphy, et al., "High-Yield, Nondestructive Purification and Quantification Method for Multiwalled Carbon Nanotubes," J. Phys. Chem. B, 2002, vol. 106, pp. 3087-3091.
Nerushev, et al., "Carbon Nanotube Films Obtained by Thermal Chemical Vapour Deposition," J. Mater. Chem., vol. 11, 2001, pp. 1122-1132.
Niu, et al., "High Power Electrochemical Capacitors Based on Carbon Nanotube Electrodes," Appl. Phys. Ltrs., vol. 70, No. 11, Mar. 1997, pp. 1480-1482.
Niyogi, et al., "Ultrasonic Dispersioins of Single-Walled Carbon Nanotubes," J. Phys. Chem. B, 2003, vol. 107, pp. 8799-8804.
Novak, et al., "Nerve Agent Using Networks of Single-Walled Carbon Nanotubes," Appl. Phys. Ltr, vol. 83, No. 19, Nov. 2003, pp. 4026-4028.

(56) References Cited

OTHER PUBLICATIONS

O'Connell, et al., "Reversible Water-Solubilization of Single-Walled Carbon Nanotubes by Polymer Wrapping," Chem. Phys. Ltrs., 2001, vol. 342, pp. 265-271.
Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Sensors and Actuators B, vol. 113, 2006, pp. 55-63.
Peigney, et al., "A Study of the Formation of Single- and Double-Walled Carbon Nanotubes by a CVD Method," J. Phys. Chem. B, vol. 105, 2001, pp. 9699-9710.
Pompeo, et al., "Water Solubilization of Single-Walled Carbon Nanotubes by Functionalization with Glucosamine," Nano Letters, 2002, vol. 2, No. 4, pp. 369-373.
Qi, et al., "Toward Large Arrays of Multiplex Functionalized Carbon Nanotube Sensors for Highly Sensitive and Selective Molecular Detection," Nano Letters, vol. 3, No. 3, 2003, pp. 347-351.
Riggs, et al., "Optical Limiting Properties of Suspended and Solubilized Carbon Nanotubes," J. Phys. Chem. B, 2000, vol. 104, pp. 7071-7076.
Riggs, et al., "Strong Luminescence of Solubilized Carbon Nanotubes," J. Am. Chem. Soc., 2000, vol. 122, pp. 5879-5880.
Rinzler, et al., "Large-Scale Purification of Single-Wall Carbon Nanotubes: Process, Product and Characterization," App. Phys. A, 1998, vol. 67, pp. 29-37.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, 2000, vol. 289, pp. 94-97.
Servalli, G., "A 45nm Generation Phase Change Memory Technology," IEDM 2009 Technical Digest, pp. 5.7.1-5.7.4.
Shelimov, et al., "Purification of Single-Wall Carbon Nanotubes by Electronically Assisted Filtration," Chem. Phys. Ltrs., vol. 282, 1998, pp. 429-434.
Snow, et al., "Random Networks of Carbon Nanotubes as an Electronic Material," App. Phys. Ltrs., vol. 82, No. 13, Mar. 2003, pp. 2145-2147.
Sotiropoulou, et al., "Carbon Nanotube Array-Based Biosensor," Anal Bioanal Chem, vol. 375, 2003, pp. 103-105.
Star, et al., "Preparation and Properties of Polymer-Wrapped Single-Walled Carbon Nanotubes," Angew. Chem. Int. Ed., 2001, vol. 40, No. 9, pp. 1721-1725.
Star, et al., "Nanoelectronic Carbon Dioxide Sensors," Adv. Mater., vol. 16, No. 22, 2004, pp. 2049-2052.
Star, et al., "Nanotube Optoelectronic Memory Devices," Nano Letters, vol. 4, No. 9, 2004, pp. 1587-1591.
Sun, et al., "High Dissolution and Strong Light Emission of Carbon Nanotubes in Aromatic Amine Solvents," J. Am. Chem. Soc., 2001, vol. 123, pp. 5348-5349.
Sun, et al., "Soluble Dendron-Functionalized Carbon Nanotubes: Preparation, Characterization, and Properties," Chem. Mater., 2001, vol. 13, pp. 2864-2869.
TIPO's Search Report for ROC Patent Application No. 094118087, 1 pg.
Valentini, et al., "Sensors for sub-ppm NO2 Gas Detection Based on Carbon Nanotube Thin Films," Appl. Phys. Ltrs., vol. 82, No. 6, Feb. 2003, pp. 961-963.
Vivekchand, et al., "A New Method of Preparing Single-Walled Carbon Nanotubes," Proc. Indian Acad. Sci.
Ward, et al., "A Non-Volatile Nanoelectromechanical Memory Element Utilizing a Fabric of Carbon Nanotubes," IEEE 2004, pp. 34-38.
Zhang, et al., "Metal Coating on Suspended Carbon Nanotubes and its Implications to Metal-tube Interaction," Chem. Phys. Ltrs., vol. 331, 2000, pp. 35-41.
Zhang, et al., "Select Pathways to Carbon Nanotube Film Growth," Adv. Mater., vol. 13, No. 23, Dec. 2001, pp. 1767-1770.
Zhang, et al., "Formation of Metal Nanowires on Suspended Single-Walled Carbon Nanotubes," Appl. Phys. Ltrs., vol. 77, No. 19, Nov. 2000, pp. 3015-3017.
Zhao, et al., "Frequency-Dependent Electrical Transport in Carbon Nanotubes," Phys. Review B, vol. 64, 2001, pp. 201402-1-201402-4.
Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.
Supplemental European Search Report, EP Patent Application No. 11742942, dated Jul. 14, 2015.
Niyogi, et al., "Selective Aggregation of Single-Walled Carbon Nanotubes via Salt Addition," J. AM. Chem. Soc., vol. 129, No. 7, pp. 1898-1899.

* cited by examiner

METHODS FOR CONTROLLING DENSITY, POROSITY, AND/OR GAP SIZE WITHIN NANOTUBE FABRIC LAYERS AND FILMS

TECHNICAL FIELD

The present disclosure relates generally to nanotube fabric layers and films and, more specifically, to a method of controlling density, porosity and/or gap size within nanotube fabric layers and films.

CROSS-REFERENCE TO PRIOR AND RELATED APPLICATIONS

This application is a U.S. national phase application under 35 U.S.C. §371 of International Patent Application No. PCT/US2011/024710 filed on Feb. 14, 2011, entitled METHODS FOR CONTROLLING DENSITY, POROSITY, AND/OR GAP SIZE WITHIN NANOTUBE FABRIC LAYERS AND FILMS, which claims priority under 35 U.S.C. §119(e) to U.S. Provisional Patent Application No. 61/304,045, filed Feb. 12, 2010, which is incorporated by reference its entirety. This application is also related to the following U.S. patents, which are assigned to the assignee of the present application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Devices Having Horizontally-Disposed Nanofabric Articles and Methods of Making the Same (U.S. Pat. No. 7,259,410), filed Feb. 11, 2004;

Devices Having Vertically-Disposed Nanofabric Articles and Methods of Making Same (U.S. Pat. No. 6,924,538), filed Feb. 11, 2004;

Resistive Elements Using Carbon Nanotubes (U.S. Pat. No. 7,365,632), filed Sep. 20, 2005; and Spin-Coatable Liquid for Formation of High Purity Nanotube Films (U.S. Pat. No. 7,375,369), filed Jun. 3, 2004.

This application is related to the following patent applications, which are assigned to the assignee of the application, and are hereby incorporated by reference in their entirety:

Methods of Making Carbon Nanotube Films, Layers, Fabrics, Ribbons, Elements, and Articles (U.S. patent application Ser. No. 10/341,005), filed Jan. 13, 2003;

High Purity Nanotube Fabrics and Films (U.S. patent application Ser. No. 10/860,332), filed Jun. 3, 2004;

Aqueous Carbon Nanotube applicator Liquids and Methods for Producing Applicator Liquids Thereof (U.S. patent application Ser. No. 11/304,315), filed Dec. 15, 2005; and Anisotropic Nanotube Fabric Layers and Films and Methods of Forming Same (U.S. patent application Ser. No. 12/533,687), filed Jul. 31, 2009.

BACKGROUND

Any discussion of the related art throughout this specification should in no way be considered as an admission that such art is widely known or forms part of the common general knowledge in the field.

Nanotube fabric layers and films are used in a plurality of electronic structures, and devices. For example, U.S. patent application Ser. No. 11/835,856 to Bertin et al., incorporated herein by reference in its entirety, teaches methods of using nanotube fabric layers to realize nonvolatile devices such as, but not limited to, block switches, programmable resistive elements, and programmable logic devices. U.S. Pat. No. 7,365,632 to Bertin et al., incorporated herein by reference, teaches the use of such fabric layers and films within the fabrication of thin film nanotube based resistors. U.S. patent application Ser. No. 12/066,063 to Ward et al., incorporated herein by reference in its entirety, teaches the use of such nanotube fabrics and films to form heat transfer elements within electronic devices and systems.

Through a variety of previously known techniques (described in more detail within the incorporated references) nanotube elements can be rendered conducting, non-conducting, or semi-conducting before or after the formation of a nanotube fabric layer or film, allowing such nanotube fabric layers and films to serve a plurality of functions within an electronic device or system. Further, in some cases the electrical conductivity of a nanotube fabric layer or film can be adjusted between two or more non-volatile states as taught in U.S. patent application Ser. No. 11/280,786 to Bertin et al., incorporated herein by reference in its entirety, allowing for such nanotube fabric layers and films to be used as memory or logic elements within an electronic system.

U.S. Pat. No. 7,334,395 to Ward et al., incorporated herein by reference in its entirety, teaches a plurality of methods for forming nanotube fabric layers and films on a substrate element using preformed nanotubes. The methods include, but are not limited to, spin coating (wherein a solution of nanotubes is deposited on a substrate which is then spun to evenly distribute said solution across the surface of said substrate), spray coating (wherein a plurality of nanotube are suspended within an aerosol solution which is then dispersed over a substrate), and dip coating (wherein a plurality of nanotubes are suspended in a solution and a substrate element is lowered into the solution and then removed). Further, U.S. Pat. No. 7,375,369 to Sen et al., incorporated herein by reference in its entirety, and U.S. patent application Ser. No. 11/304,315 to Ghenciu et al., incorporated herein by reference in its entirety, teach nanotube solutions well suited for forming a nanotube fabric layer over a substrate element via a spin coating process.

SUMMARY OF THE DISCLOSURE

The current disclosure relates to a method for controlling density, porosity and/or gap size within nanotube fabric layers and films.

In particular, the present disclosure provides a nanotube fabric layer including a plurality of individual nanotube elements where open regions between said individual nanotube elements within the nanotube fabric layer define gaps within said nanotube fabric layer and where the gaps are limited in physical dimension to be smaller than a threshold. In some embodiments, a nanotube switching device includes such a nanotube fabric layer.

The present disclosure also provides a nanotube fabric layer including a plurality of individual nanotube elements where open regions between said individual nanotube elements within said nanotube fabric layer define a porosity of said nanotube fabric layer and where said porosity is selected to provide a uniform density of individual nanotube elements within the nanotube fabric layer. In some embodiments, the nanotube fabric layer has a high porosity. In some embodiments, the nanotube fabric layer has a low porosity. In some embodiments, a nanotube switching device includes such a nanotube fabric layer.

The present disclosure also provides a method of preparing a nanotube application solution. The method first includes forming a raw nanotube application solution, this raw nanotube application solution comprising a first plurality of nanotube elements at a first concentration level and a second plurality of ionic particles at a second concentration level dispersed in a liquid medium. The method further includes adjusting at least one of the first concentration level of the first plurality of nanotube elements and the second concentration level of the second quantity of ionic particles such as to control the degree of rafting realized within a nanotube fabric layer formed using the nanotube application solution.

According to one aspect of the present disclosure, the first plurality of nanotube elements are carbon nanotubes.

Under another aspect of the present disclosure, the first plurality of nanotube elements are single walled carbon nanotubes.

Under another aspect of the present disclosure, the first plurality of nanotube elements are multi-walled carbon nanotubes.

Under another aspect of the present disclosure, the second plurality of ionic particles include ammonium nitrate salts.

Under another aspect of the present disclosure, the second plurality of ionic particles include ammonium formate.

Under another aspect of the present disclosure, the second plurality of ionic particles include ammonium acetate.

Under another aspect of the present disclosure, the second plurality of ionic particles include ammonium carbonate.

Under another aspect of the present disclosure, the second plurality of ionic particles include ammonium bicarbonate ionic organic species, and ionic polymers Under another aspect of the present disclosure, the second plurality of ionic particles include ionic organic species.

Under another aspect of the present disclosure, the second plurality of ionic particles include ionic polymers.

Under another aspect of the present disclosure, the second plurality of ionic particles include inorganic salts.

Under another aspect of the present disclosure, the liquid medium is an aqueous solution.

Under another aspect of the present disclosure, the liquid medium is a nitric acid solution.

Under another aspect of the present disclosure, the liquid medium is a sulfuric acid solution.

Under another aspect of the present disclosure, the concentration level of nanotube elements within the nanotube application solution is increased in order to promote rafting in a nanotube fabric layer formed with such a solution.

Under another aspect of the present disclosure, the concentration level of nanotube elements within the nanotube application solution is decreased in order to discourage rafting in a nanotube fabric layer formed with such a solution.

Under another aspect of the present disclosure, the concentration level of ionic particles within the nanotube application solution is decreased in order to promote rafting in a nanotube fabric layer formed with such a solution.

Under another aspect of the present disclosure, the concentration level of ionic particles within the nanotube application solution is increased in order to discourage rafting in a nanotube fabric layer formed with such a solution.

Other features and advantages of the present invention will become apparent from the following description of the invention which is provided below in relation to the accompanying drawings.

DETAILED DESCRIPTION

Figure 1:
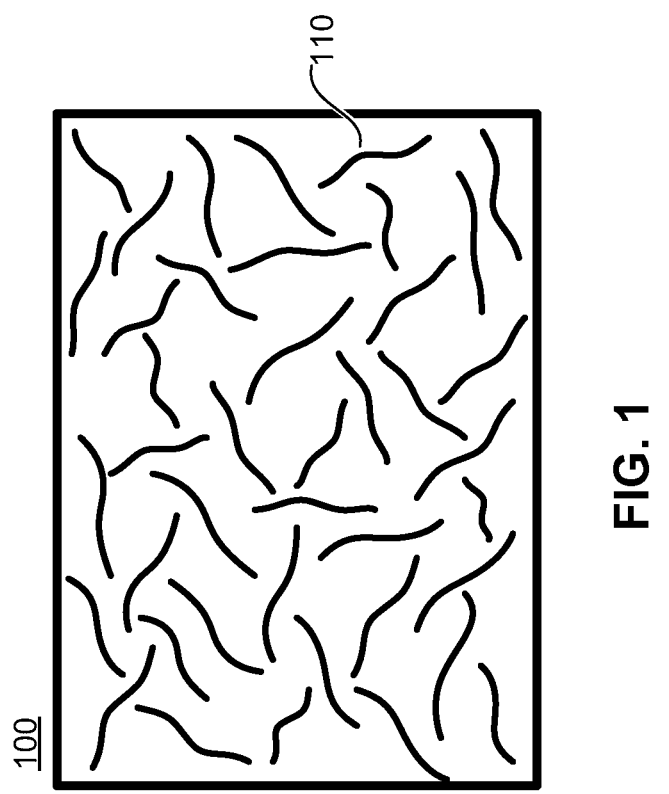
FIG. 1 is an illustration depicting a nanotube fabric layer exhibiting essentially no rafting of the individual nanotube elements.

The present disclosure teaches methods to increase or reduce the number of nanotube elements in a given area of nanotube fabric layers and films. These approaches can selectively create high density, low porosity nanotube fabrics in a controlled way. In this manner, for example, nanotube fabrics may be created in which essentially all gaps or pores between nanotubes within the fabric are no larger than a predetermined size. This is particularly useful for devices with extremely small circuit sizes in which a uniform dispersion of nanotubes is desired. For example, when a fabric with a high density and low porosity is patterned and etched, the remaining nanotube article is effectively assured of containing nanotubes as opposed to lacking nanotubes as a result of a large pore in the fabric. As the feature sizes decrease along with currently practiced lithography techniques, minimizing the porosity becomes more important to ensure a higher yield of functional circuit elements as the fabric is being etched. For example, the high density, low porosity fabrics can have nanotube free regions, i.e., pores that are less than the size of the small circuits according to the current lithography techniques (e.g., pores that are less than about 10 nm). Thus, the density or pore size is controlled such that the minimum number of nanotube elements required for operation can be utilized in a critical feature size of current lithography techniques, (e.g. 20 nm or less) which can be less than 20 nm.

Conversely, the methods can be used to create highly porous, low density fabrics, if so desired. For example, it may desirable to have a nanotube fabric where the nanotubes are dispersed to increase the optical transparency of the nanofabric. In other applications, where a thicker fabric, formed of multiple layers of nanotube fabrics, is desired, it may be preferable to limit the concentration of nanotubes to reduce cost and the electrical resistance of the fabric. Further, for low density and high porosity fabrics, it is also important that the nanotubes be dispersed in a uniform manner across the fabric.

Fabric porosity and density may be controlled in a variety of ways including, but not limited to, techniques for controlling rafting within the nanotube fabric. These fabrics can then be used in nanotube switching devices.

As described within U.S. Pat. No. 7,375,369 to Sen et al. and U.S. patent application Ser. No. 11/304,315 to Ghenciu et al., both incorporated herein by reference in their entireties, nanotube fabrics and films can be formed by applying a nanotube application solution (for example, but not limited to, a plurality of individual nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes or dip coating processes) can be used to apply and distribute the nanotube elements over the substrate element.

It should be noted that nanotube elements used and referenced within the embodiments of the present disclosure may be single walled nanotubes, multi-walled nanotubes, or mixtures thereof and may be of varying lengths. Further, the nanotubes may be conductive, semiconductive, or combinations thereof.

Within many applications it is desirable to control the porosity of a nanotube fabric layer as it is formed—that is, to control how closely packed together or sparsely distributed the individual nanotube elements within the fabric layer are. In one example, a high porosity uniform nanotube fabric may have voids—that is gaps in the fabric between individual nanotube elements—on the order of 50 nm in size. In another example, a low porosity uniform nanotube fabric layer may have voids on the order of 10 nm in size.

In some applications the sheet resistance of a nanotube fabric layer may be controlled by controlling the porosity of the nanotube fabric layer, or a density of nanotubes in the fabric, along with other variables (such as, but not limited to, the length of the individual nanotube elements within the fabric and the thickness of the nanotube fabric layer). By controlling the porosity of a nanotube fabric layer, such a fabric layer can be reliably tuned to have a sheet resistance from about 1 k-Ohm/square to about 1 M-Ohm/square.

In another applications by limiting the porosity of a nanotube fabric layer the density of an array of nanotube switching devices may be increased. U.S. patent application Ser. No. 11/280,786 to Bertin et al., incorporated herein by reference in its entirety, teaches a nonvolatile two terminal nanotube switch structure having (in at least one embodiment) a nanotube fabric article deposited between two electrically isolated electrode elements. As Bertin teaches, by placing different voltages across said electrode elements, the resistive state of the nanotube fabric article can be switched between a plurality of nonvolatile states. That is, in some embodiments the nanotube fabric article can be repeatedly switched between a relatively high resistive state (resulting in, essentially, an open circuit between the two electrode elements) and a relatively low resistive state (resulting in, essentially, a short circuit between the two electrode elements).

The fabrication of an array of such nanotube switching devices can include patterning of a nanotube fabric layer to realize a plurality of these nanotube fabric articles. The porosity of a nanotube fabric layer—or more specifically the size of the voids within a nanotube fabric layer—can limit the feature size to which these nanotube fabric articles can be patterned. For example, to fabricate a nanotube switching device array wherein the individual nanotube switching devices are on the order of 20 nm square (that is, the nanotube fabric article within each device is essentially 20 nm by 20 nm), the porosity of the nanotube fabric array may need to be such that voids within the nanotube fabric layer are on the order of 10 nm. In this way, the fabrication of highly dense nanotube memory arrays (wherein the individual nanotube switching elements within the array are patterned at a sub 20 nm geometry, for example) can require highly dense (that is, less porous with void sizes on the order of 10 nm or less) nanotube fabric layers.

One method of controlling the porosity of a nanotube fabric layer is to control the degree of rafting—that is, the percentage of nanotube elements within the fabric layer which tend to bundle together along their sidewalls—within the nanotube fabric layer. By controlling certain parameters during the formation of a nanotube fabric layer, a nanotube fabric layer can be formed which is highly rafted (and, consequently, highly dense—for example, with voids on the order of 10 nm), moderately rafted (and, consequently, marginally dense—for example, with voids on the order of 25 nm), or substantially free from rafts (and consequently, highly porous—for example with voids on the order of 50 nm).

FIG. 1 depicts a nanotube fabric layer 100 which is substantially free of rafts. As described above, within such a fabric layer individual nanotube elements 110 are formed into a uniform highly porous fabric wherein the individual nanotube elements are arranged in substantially random orientations. For example, the voids within such a fabric layer 100 might range between 25 nm and 50 nm, corresponding to a sheet resistance between about 1000 k-Ohm/ square to 1M-Ohm/square within a single fabric layer. A thicker fabric layer may be formed with substantially the same porosity by applying (through multiple spin coating operations, for example) multiple fabric layers over the nanotube fabric layer 100 illustrated in FIG. 1.

Figure 2A:
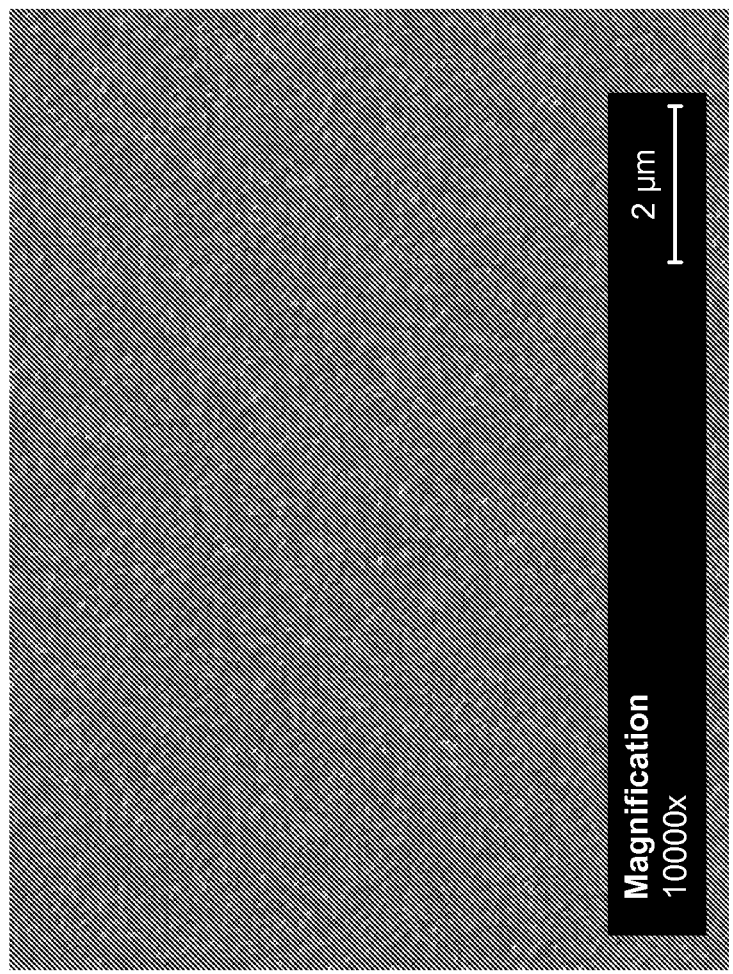
FIGS. 2A-2B are SEM images (at different magnifications) of a nanotube fabric layer exhibiting essentially no rafting of the individual nanotube elements.
Figure 2B:
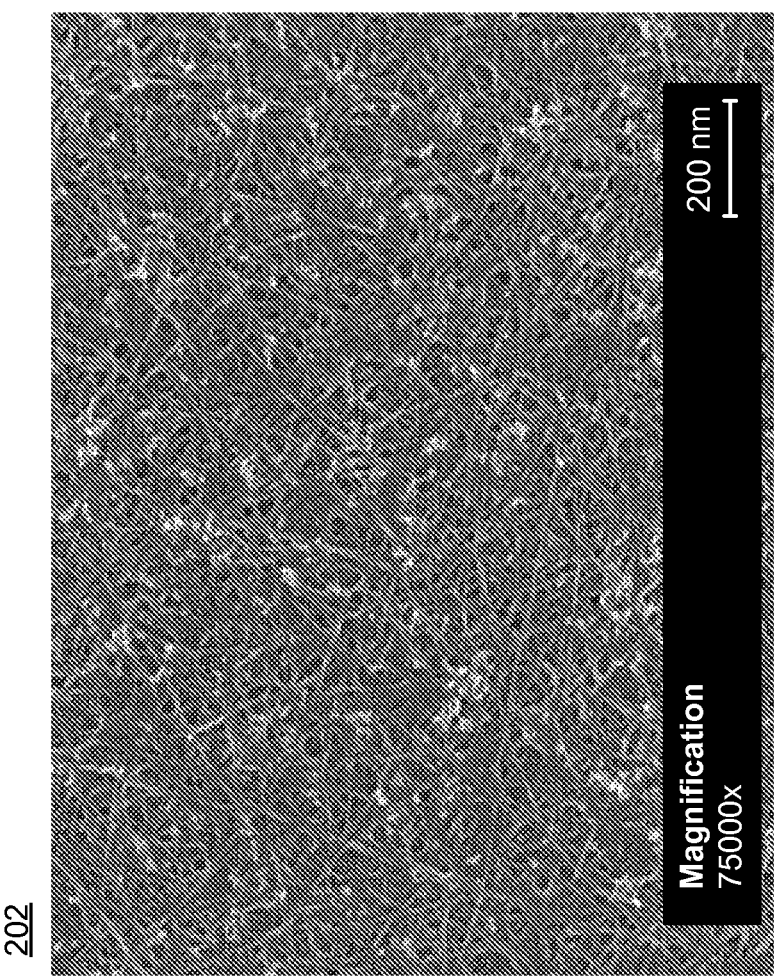

FIGS. 2A and 2B are SEM images depicting an exemplary nanotube fabric layer (201 and 202, respectively) substantially free of rafts and analogous to the nanotube fabric layer 100 depicted in FIG. 1. FIG. 2A shows the nanotube fabric layer 201 at a 10,000× magnification, and FIG. 2B shows the nanotube fabric layer 202 at a 75,000× magnification. Within both images, the random orientation—and essentially complete lack of rafting—is evident within the exemplary nanotube fabric layer.

Figure 3:
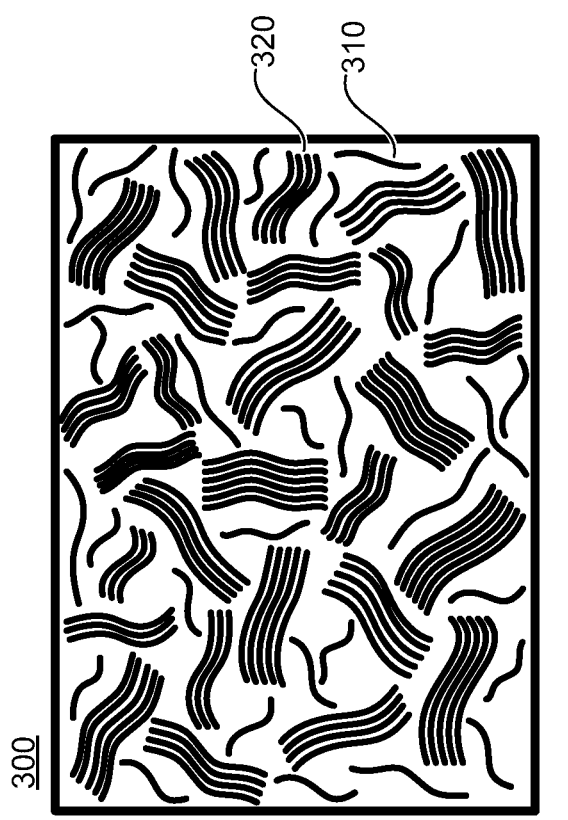
FIG. 3 is an illustration depicting a nanotube fabric layer exhibiting substantial rafting of the individual nanotube elements, according to one or more embodiments of the present disclosure.

FIG. 3 depicts a nanotube fabric layer 300 which includes a moderate number of rafted nanotube bundles 320 as well as a number of unbundled nanotube elements 310. Within such a fabric layer, individual nanotube elements within the rafted bundles 320 are packed tightly together such as to minimize the porosity within that region of the nanotube fabric layer 300. In this way, the nanotube fabric layer 300 is significantly denser as compared to the fabric layer 100 illustrated in FIG. 1. For example, the voids within such a fabric layer 300 might range between 10 nm and 20 nm, corresponding to a sheet resistance between about 10 k-Ohm/square to 100 k-Ohm/square within a single fabric layer. A thicker fabric layer may be formed with substantially the same porosity by applying (through multiple spin coating operations, for example) multiple fabric layers over the nanotube fabric layer 300 illustrated in FIG. 3.

Figure 4A:
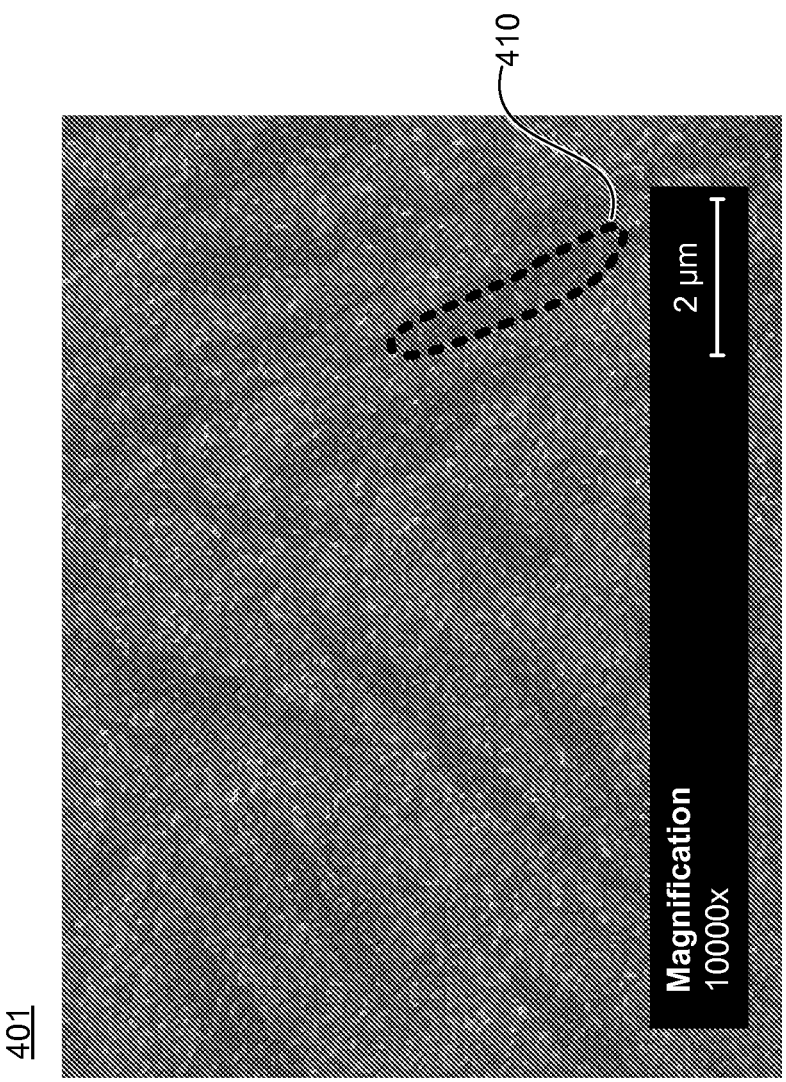
FIGS. 4A-4B are SEM images (at different magnifications) of a nanotube fabric layer exhibiting substantial rafting of the individual nanotube elements, according to one or more embodiments of the present disclosure.
Figure 4B:
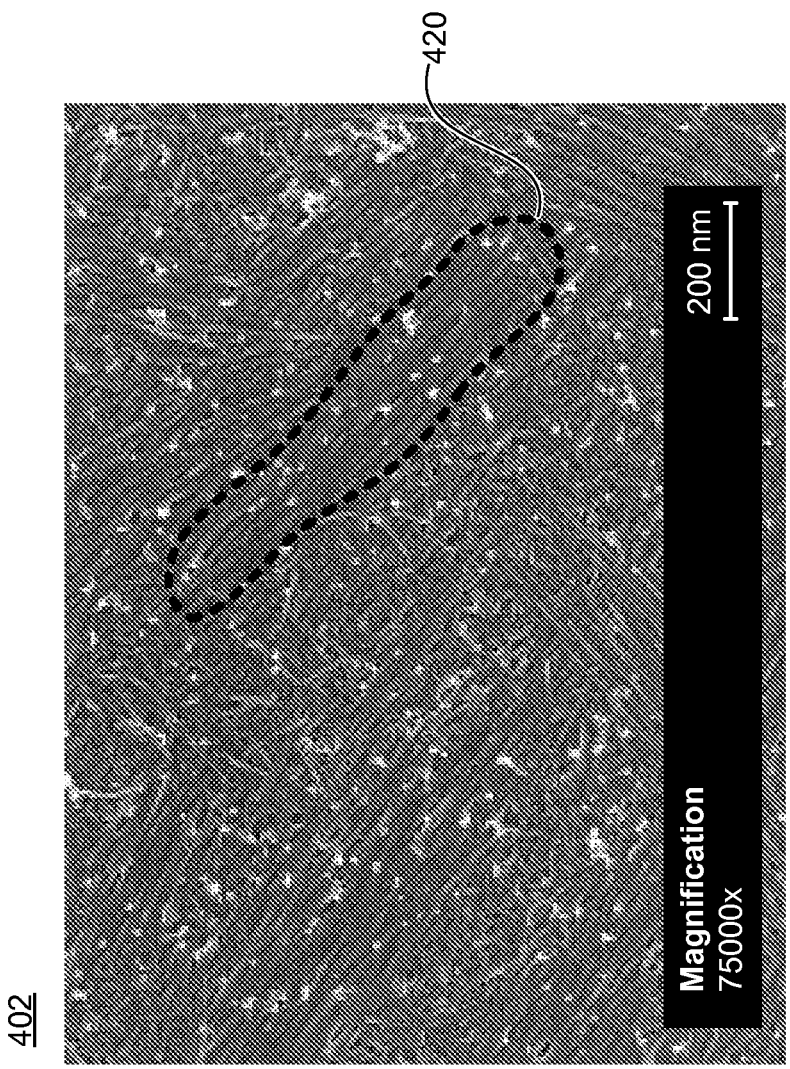

FIGS. 4A and 4B are SEM images depicting an exemplary nanotube fabric layer (401 and 402, respectively) which exhibits a moderate amount of rafting and is analogous to the nanotube fabric layer 300 depicted in FIG. 3. FIG. 4A shows the nanotube fabric layer 401 at a 10,000× magnification, and FIG. 4B shows the nanotube fabric layer 402 at a 75,000× magnification. Within both images, the randomly oriented bundles of rafted nanotube elements (410 and 420, respectively) are evident within the exemplary nanotube fabric layer.

In some cases, rafting of individual nanotube elements can occur because during the formation of a nanotube fabric layer groups of nanotube elements bundle together along their sidewalls due to van der Waals interactions (atomic level forces between the individual nanotube elements) or through Π-Π interactions (a stacking effect due to the presence of a free electrons in the Π-orbitals along the nanotube structure). Within an application solution—that is, a dispersion of individual nanotube elements within a liquid medium—the van der Waals and Π-Π interactions can be promoted or discouraged by the presence of certain ionic species within the solution. Such ionic species include, but are not limited to, ammonium salts, nitrate salts, ammonium nitrate salts, ammonium formate, ammonium acetate, ammonium carbonate, ammonium bicarbonate, ionic organic species, ionic polymers, and inorganic salts. A high concentration of such ionic species within the application solution (for example, on the order of 20 ppm or more ammonium nitrate salts within an aqueous nanotube application solution) will tend to interfere with these interactions and thereby reduce the degree of rafting within a nanotube fabric layer formed with such an application solution. Conversely, a low concentration of such ionic species within the application solution (for example, on the order of 10 ppm or less ammonium nitrate salts within an aqueous nanotube application solution) will tend to allow a plurality of these rafted bundles to form within a nanotube fabric layer.

It should be noted that this rafting effect—wherein a plurality of nanotube elements bundle together along their sidewalls to realize an orderly raft like structure—is different from the so-called clumping defects described within U.S. patent application Ser. No. 11/304,315 to Ghenciu et al., the entire disclosure of which is hereby incorporated by reference. The clumping defects described by Ghenciu are the result of precipitation or aggregation of the individual nanotube elements within the solution and are characterized by individual nanotube elements twisting around each other and bundling into clump like structures within the application solution. Such undesirable clumping defects can result in non-uniform and non-planar nanotube fabric layers. Conversely, as described by the present disclosure, a rafted nanotube fabric can remain, in most cases, substantially uniform and thus can be employed to control the density of a nanotube fabric layer. Further, the rafts described herein are essentially two dimensional nanotube structures, i.e., the height of the raft is generally one nanotube thick. The clumping defects referenced in Ghenciu generally result in three dimensional nanotube clumps.

Rafting also can be promoted (or discouraged) by controlling the concentration of nanotube elements with an application solution—that is, by controlling the number of individual nanotube elements per unit volume present within the applicator liquid. Van der Waals interactions between closely situated nanotube elements within a highly concentrated application solution (for example, an application solution with an optical density on the order of 35) can tend to increase the incidence of rafting within a nanotube fabric layer formed with such a solution. Conversely, an application solution with a relatively low concentration of nanotube elements (for example, an application solution with an optical density on the order of 10) can significantly reduce the opportunity for these van der Waals interactions and result in less rafting. It should be noted that optical density (a spectrographic technique well known to those skilled in the art) is typically used to characterize the density of nanotube elements within an application solution. The technique relies on measuring the amount of light absorbed by a nanotube application solution—essentially the light absorbed by the individual nanotube elements within such a solution—to determine the concentration of nanotube elements dispersed in the solution. For example, a solution with an optical density of 30 corresponds to approximately 0.1% concentration (by weight) of nanotube elements within the solution.

The use of these two parameters (the concentration of an ionic species within the application solution and nanotube concentration within the application solution) to control the degree of rafting within a nanotube fabric layer is illustrated in the exemplary nanotube fabric layers depicted in FIGS. 7A-7C, 8A-8C, 9A-9C, 10A-10C, and 11A-11C and described in detail within the discussion of those figures.

In addition, within certain applications other parameters of a nanotube application solution may contribute to the degree to which a nanotube fabric layer formed with that solution will raft. Such parameters include, but are not limited to, the presence of other carbon allotropes (for example, amorphous carbon), the temperature of the application solution as it is applied to the surface of a wafer or other substrate, the chemical composition of the liquid medium used, the method used for depositing the application solution to the surface of a wafer or other substrate, and the acidity of the solution.

Figure 5:
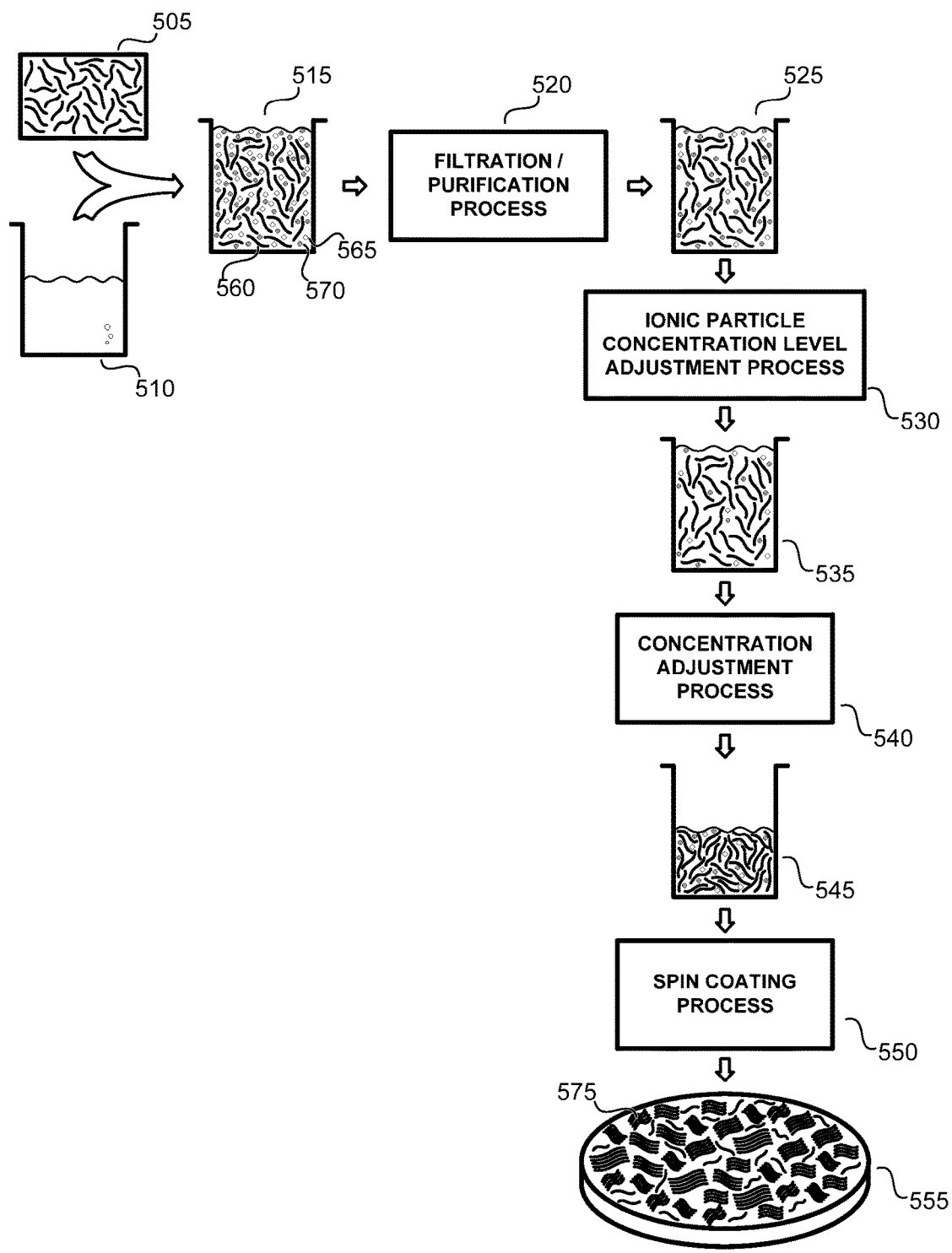
FIG. 5 is a process diagram illustrating a method according to the present disclosure of preparing a nanotube application solution such as to form a highly rafted nanotube fabric layer.

FIG. 5 illustrates an exemplary application solution preparation process according to the methods of the present disclosure which is well suited for forming a rafted nanotube fabric layer.

At the start of the application solution preparation process illustrated in FIG. 5, a plurality of individual nanotube elements 505 is dispersed into a liquid medium 510 (such as, but not limited to, an aqueous solution, a sulfuric acid solution, or a nitric acid solution) to form raw nanotube application solution 515. Raw nanotube application solution 515 includes a plurality of individual nanotube elements 560, a plurality of impurities (such as, but not limited to, residual metallic catalyst particles, amorphous carbon particles, and other carbonaceous impurities) 565, and a concentration of an ionic particles 570 (such as, but not limited to, ammonium salts, nitrate salts, ammonium nitrate salts, ammonium formate, ammonium acetate, ammonium carbonate, ammonium bicarbonate, ionic organic species, ionic polymers, and inorganic salts). The raw nanotube application solution 515 is then passed through a filtration/purification process 520 which removes a significant percentage of impurities 565 to realize purified nanotube application solution 525. A typical filtration/purification process 520 also can remove a percentage of the ionic particles 570 within raw nanotube application solution 515, as is shown in the graphic representation of the purified nanotube application solution 525 in FIG. 5.

A typical purified nanotube application solution 525 can include less than $1\times10^{18}$ atoms/cm$^3$ of impurities 565 and be substantially free of particle impurities 565 having a diameter of greater than about 500 nm. It also can include a nanotube concentration of 100 mg/l (a nanotube concentration well suited for memory and logic applications). This typical purified nanotube application solution 525 might also include an ionic species of ammonium nitrate salt at a concentration of about 15 ppm.

The formation and purification of nanotube application solutions (such as described above) is taught in U.S. Pat. No. 7,375,369 to Sen et al. as well as U.S. patent application Ser. No. 11/304,315 to Ghenciu et al. Within both references, a plurality of filtration/purification processes are detailed, including cross flow filtration, nitric acid treatment, hydrochloric acid treatment, and high speed centrifugation.

Within the exemplary process detailed in FIG. 5, the purified nanotube application solution 525 is then passed through an ionic particle concentration level adjustment process 530 which further reduces the concentration of ionic particles 570 within the purified application solution 530 resulting in intermediate application solution 535. For an exemplary ionic species of ammonium nitrate salts, this intermediate application solution 535 can have an ionic particle concentration level of less than 10 ppm. This ionic particle concentration level adjustment process 530 may be realized through an additional filtering process (such as, but not limited to, a cross flow filtration process, a sonication filtration process, and a centrifugation filtration process).

In a next process step, intermediate application solution 535 is passed through a nanotube concentration adjustment process 540, which increases the concentration of nanotube elements within the intermediate application solution 535 resulting in a final application solution 545, which is well suited for forming a rafted nanotube fabric layer. For example, the nanotube application solution can be adjusted such that final application solution 545 possesses an optical density on the order of 35. Typically such a nanotube concentration adjustment process 540 is realized by removing a volume of the liquid medium 510 from the solution, though the methods of the present disclosure are not limited in this regard.

Within the exemplary process detailed in FIG. 5, a spin coating process 550 is used to apply final nanotube application solution 545 over a silicon wafer to realize rafted nanotube fabric layer 555 wherein a plurality of rafted bundles of nanotube elements 575 are distributed throughout the fabric layer.

In this way a purified nanotube application solution 525 (prepared according to the methods taught by Sen and Ghenciu) is rendered into an application solution 545 well suited for forming a rafted nanotube fabric layer by reducing the concentration of ionic particles within the original purified solution in one operation and by increasing the concentration of nanotube elements within the solution in a second operation.

It should be noted that while the exemplary process detailed in FIG. 5 describes a specific nanotube application solution process in order to illustrate the methods of the present disclosure, the methods of the present disclosure are not limited to this specific example. For example, within some applications the order of the ionic particle concentration level adjustment process 530 and the nanotube concentration adjustment process 540 can be reversed (that is, the application solution first increased in nanotube concentration and then reduced in ionic particle concentration). Further, within some applications the ionic particle concentration level adjustment process 530 may be removed altogether and the nanotube concentration adjustment process 540 used alone to sufficiently render purified nanotube application solution 525 into a solution well suited for forming a rafted nanotube fabric layer. Within still other applications, the nanotube concentration adjustment process 540 may be removed altogether and the ionic particle concentration level adjustment process used alone to sufficiently render purified nanotube application solution 525 into a solution well suited for forming a rafted nanotube fabric layer.

Figure 6:
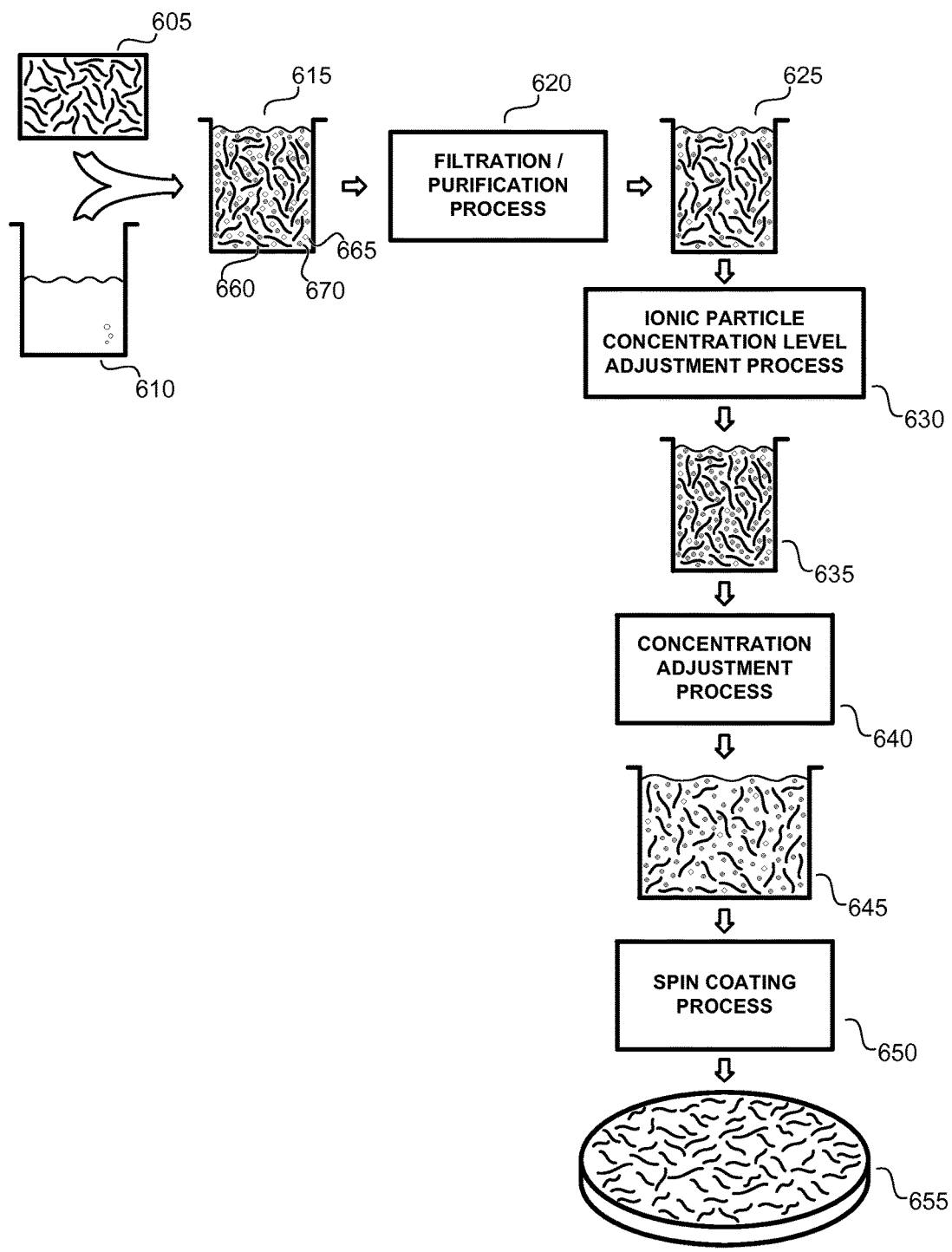
FIG. 6 is a process diagram illustrating a method according to the present disclosure of preparing a nanotube application solution such as to form a substantially non-rafted nanotube fabric layer.

FIG. 6 illustrates an exemplary application solution preparation process according to the methods of the present disclosure which is well suited for forming a nanotube fabric layer substantially free of rafted bundles of nanotube elements.

At the start of the application solution preparation process illustrated in FIG. 6, a plurality of individual nanotube elements 605 is dispersed into a liquid medium 610 (such as, but not limited to an aqueous solution, a sulfuric acid solution, or a nitric acid solution) to form raw nanotube application solution 615. Raw nanotube application solution 615 includes a plurality of individual nanotube elements 660, a plurality of impurities (such as, but not limited to, residual metallic catalyst particles, amorphous carbon particles, and other carbonaceous impurities) 665, and a concentration of ionic particles 670 (such as, but not limited to, ammonium salts, nitrate salts, ammonium nitrate salts, ammonium formate, ammonium acetate, ammonium carbonate, ammonium bicarbonate, ionic organic species, ionic polymers, and inorganic salts). The raw nanotube application solution 615 is then passed through a filtration/purification process 620 which removes a significant percentage of impurities 665 to realize purified nanotube application solution 625. A typical filtration/purification process 620 can remove a percentage of the ionic particles 670 within raw nanotube application solution 615, as is shown in the graphic representation of the purified nanotube application solution 625 in FIG. 6.

A typical purified nanotube application solution 625 can include less than $1 \times 10^{18}$ atoms/cm$^3$ of impurities 665 and be substantially free of particle impurities 665 having a diameter of greater than about 500 nm. It also can have a nanotube concentration of 100 mg/l (a nanotube concentration well suited for memory and logic applications). This typical purified nanotube application solution 625 also can include an ionic species of ammonium nitrate salt at a concentration of about 15 ppm.

The formation and purification of nanotube application solutions (such as described above) is taught in U.S. Pat. No. 7,375,369 to Sen et al. as well as U.S. patent application Ser. No. 11/304,315 to Ghenciu et al. Within both references, a plurality of filtration/purification processes are detailed, including cross flow filtration, nitric acid treatment, hydrochloric acid treatment, and high speed centrifugation.

Within the exemplary process detailed in FIG. 6, the purified nanotube application solution 625 is then passed through an ionic particle concentration level adjustment process 630 which increases the concentration of ionic particles 670 within the purified application solution 625 resulting in intermediate application solution 635. For an exemplary ionic species of ammonium nitrate salts, this intermediate application solution 535 can include an ionic particle concentration level of greater than 30 ppm. This ionic particle concentration level adjustment process 625 can be realized through the introduction of an additional quantity of ionic particles 670 into the purified application solution 625.

In a next process step, intermediate application solution 635 is passed through a nanotube concentration adjustment process 640, which decreases the concentration of nanotube elements within intermediate application solution 635 resulting in a final application solution 645, which is well suited for forming a nanotube fabric layer substantially free of rafted bundles of nanotube elements. For example the nanotube application solution can be adjusted such that final application solution 645 possesses an optical density on the order of 10. Typically, such a nanotube concentration adjustment process 640 can be realized by adding an additional volume of the liquid medium 610 into the solution, though the methods of the present disclosure are not limited in this regard.

Within the exemplary process detailed in FIG. 6, a spin coating process 650 is used to apply final nanotube application solution 645 over a silicon wafer to realize nanotube fabric layer 655 which is substantially free of rafted bundles of nanotube elements.

In this way a purified nanotube application solution 625 (prepared according to the methods taught by Sen and Ghenciu) is rendered into an application solution 645 well suited for forming a nanotube fabric layer substantially free of rafted bundles of nanotube elements by increasing the concentration of ionic particles within the original purified solution in one operation and by decreasing the concentration of nanotube elements within the solution in a second operation.

It should be noted that while the exemplary process detailed in FIG. 6 describes a specific nanotube application solution process in order to illustrate the methods of the present invention, the methods of the present invention are not limited to this specific example. Indeed, within some applications the order of the ionic particle concentration level adjustment process 630 and the nanotube concentration adjustment process 640 can be reversed (that is the application solution first decreased in nanotube concentration and then increased in ionic particle concentration). Further, within some applications the ionic particle concentration level adjustment process 630 may be removed altogether and the nanotube concentration adjustment process 640 used alone to sufficiently render purified nanotube application solution 625 into a solution well suited for forming a nanotube fabric layer substantially free from rafted bundles of nanotube elements. Within still other applications, the nanotube concentration adjustment process 640 may be removed altogether and the ionic particle concentration level adjustment process used alone to sufficiently render purified nanotube application solution 625 into a solution well suited for forming a nanotube fabric layer substantially free from rafted bundles of nanotube elements.

The following examples describe the formation of several nanotube fabric layers (with varying degrees of rafting) according to the methods of the present disclosure. Within each example, a purified nanotube application solution was first realized through the methods taught by Ghenciu in U.S. patent application Ser. No. 11/304,315 (and described in the discussions of FIGS. 5 and 6). This purified nanotube application solution was then adjusted as specified in each example to realize a specific nanotube concentration and ionic particle concentration level. Within each example the ionic species adjusted was ammonium nitrate salts. The resulting solution was then deposited on a four inch Si/SiO$_2$ wafer via a spin coating operation. For all examples, the nanotube concentration is measured in terms of optical density (a spectrographic technique well known to those skilled in the art), and the ammonium nitrate salt concentration is measured in parts-per-million (ppm) with respect to the solution.

Figure 7:
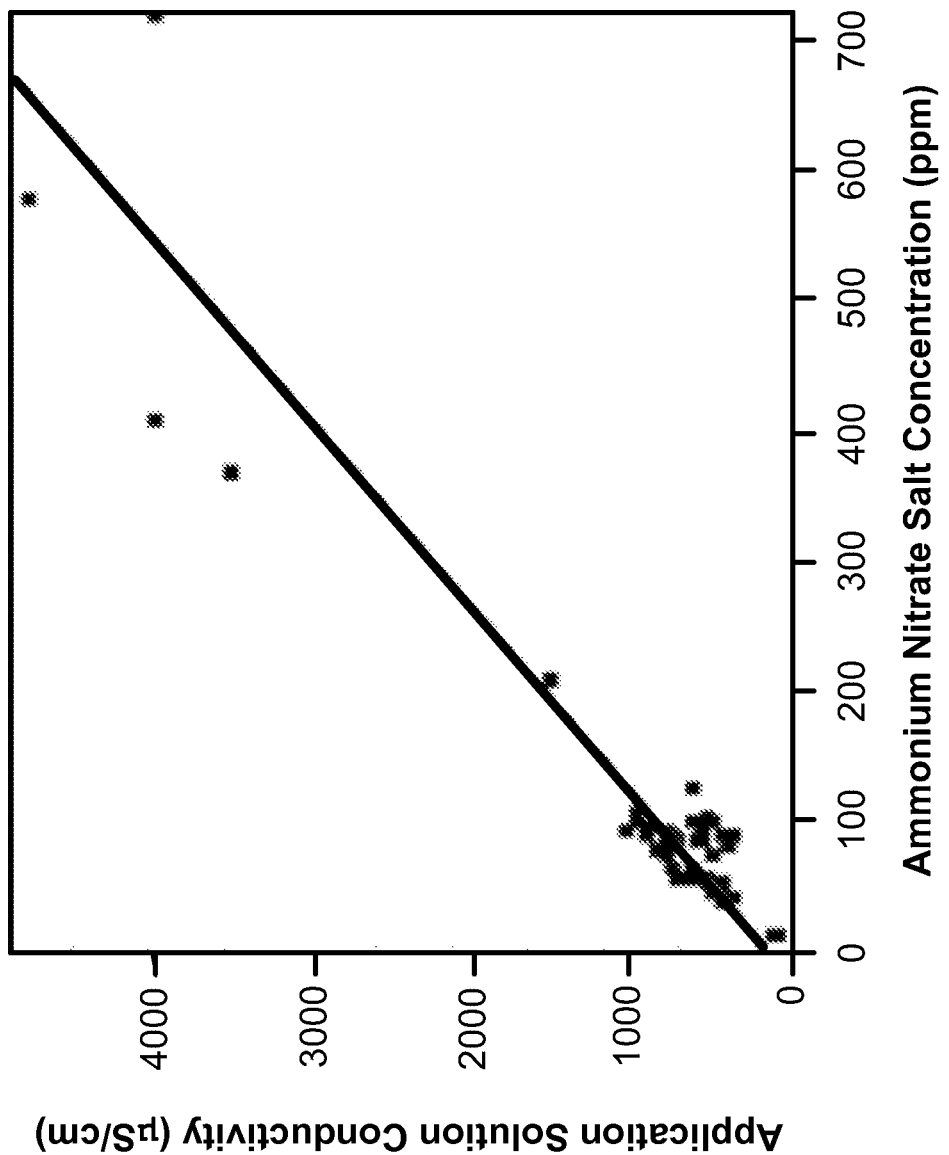
FIG. 7 is a graph plotting conductivity readings (measured in $\mu S/cm$) vs. ammonium nitrate salt levels (measure in ppm) taken on a plurality of nanotube application solutions.

It should be noted that while the following examples specify the level of ammonium nitrate salt (the exemplary ionic species used in each of the examples) in terms of ppm, another methods of tracking an ionic species concentration level may prove more convenient for some applications. FIG. 7 is a graph plotting the conductivity (measured in μS/cm) of a plurality of nanotube application solutions against the concentration level (measured in ppm) of ammonium nitrate salts in each application solution. As can be observed in FIG. 7, the conductivity of these application solutions will tend to track the concentration of ammonium nitrate salts dispersed in each. For example, within the application solutions used in the following example, a conductivity reading of approximately 700 μS/cm or higher would indicate that an application solution would be likely to promote rafting. Conversely, a conductivity reading of approximately 500 μS/cm or lower would indicate that an application solution would be likely to discourage rafting. As such, it may be convenient within some applications of the methods of the present disclosure to track and adjust the conductivity of a nanotube application solution instead of the concentration level of a particular ionic species within that application solution.

For all examples, the spin coating operation was as follows. A raw wafer was pre-baked on a 300° C. hot plate for five minutes. Approximately 3 ml of the adjusted solution was dispensed onto the wafer via a plastic pipette while the wafer was rotated at 60 rpm. After thirty seconds, the spin speed was increased to 500 rpm for two seconds, then subsequently reduced to fifty rpm for 180 seconds, and finally increased to 2000 rpm for twenty seconds. The wafer (now coated with the application solution) was then placed on a 300° C. hot plate for two minutes. After a cool down cycle, the entire process was repeated again twice such as to apply three coats of the application solution over the wafer.

For the application solutions used in the following examples it was found that generally an ammonium nitrate salt concentration level of 10 ppm or lower would tend to result in a highly rafted fabric. It was further found that generally an ammonium nitrate salt concentration level of 20 ppm or more would tend to result in fabric layers with lower incidences of rafting. Applications solutions with ammonium nitrate salt concentration levels between these ranges were found to result in fabric layers with moderate rafting.

Further, for the application solutions used in the following examples it was found that generally an optical density of approximately 10 or lower would tend to result in fabric layers with low incidences of rafting. It was further found that generally an optical density of 30 or more would tend to result in fabric layers with very high incidences of rafting. Applications solutions with optical densities between these ranges were found to result in fabric layers with moderate rafting.

Example 1

Figure 8A:
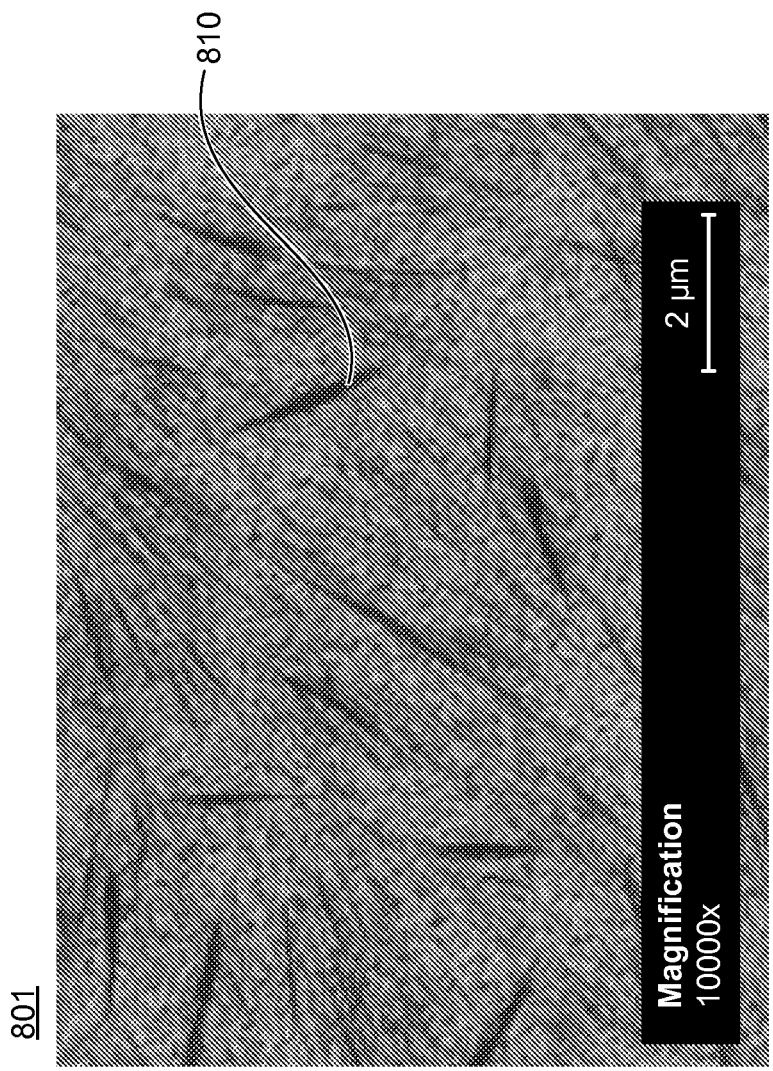
FIGS. 8A-8C are SEM images (at increasing magnifications) of an exemplary nanotube fabric layer formed according to the methods of the present disclosure which exhibits approximately 11.6% rafting.
Figure 8B:
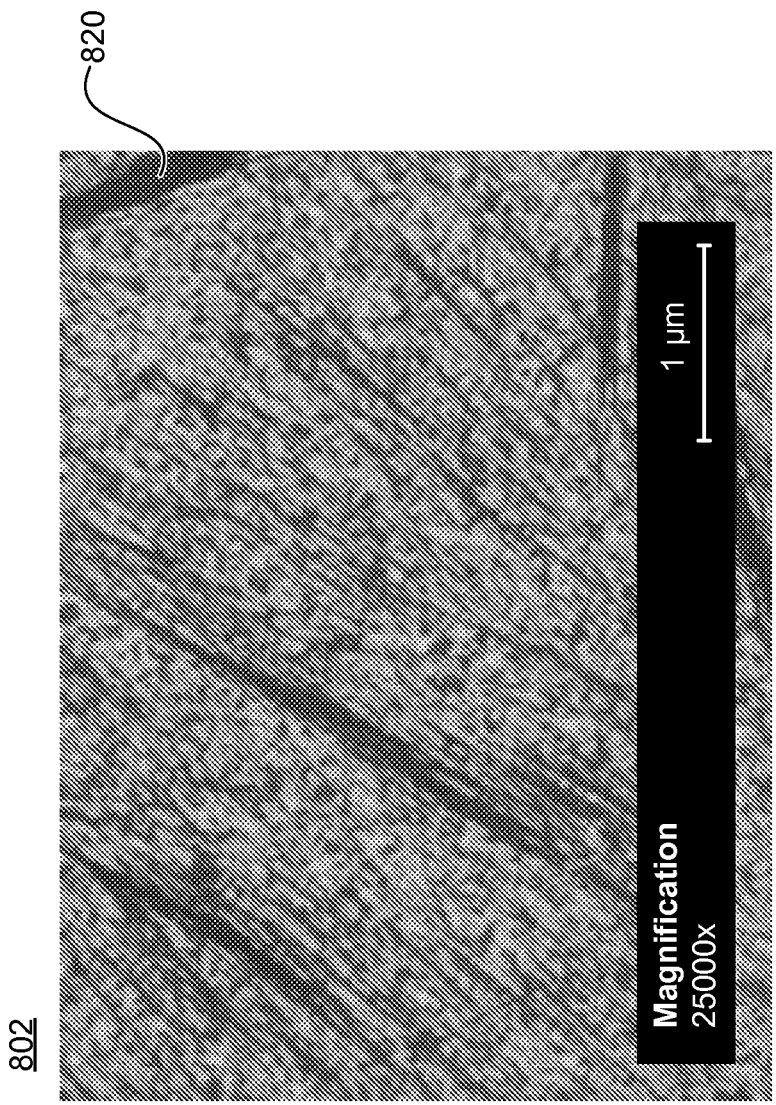
Figure 8C:
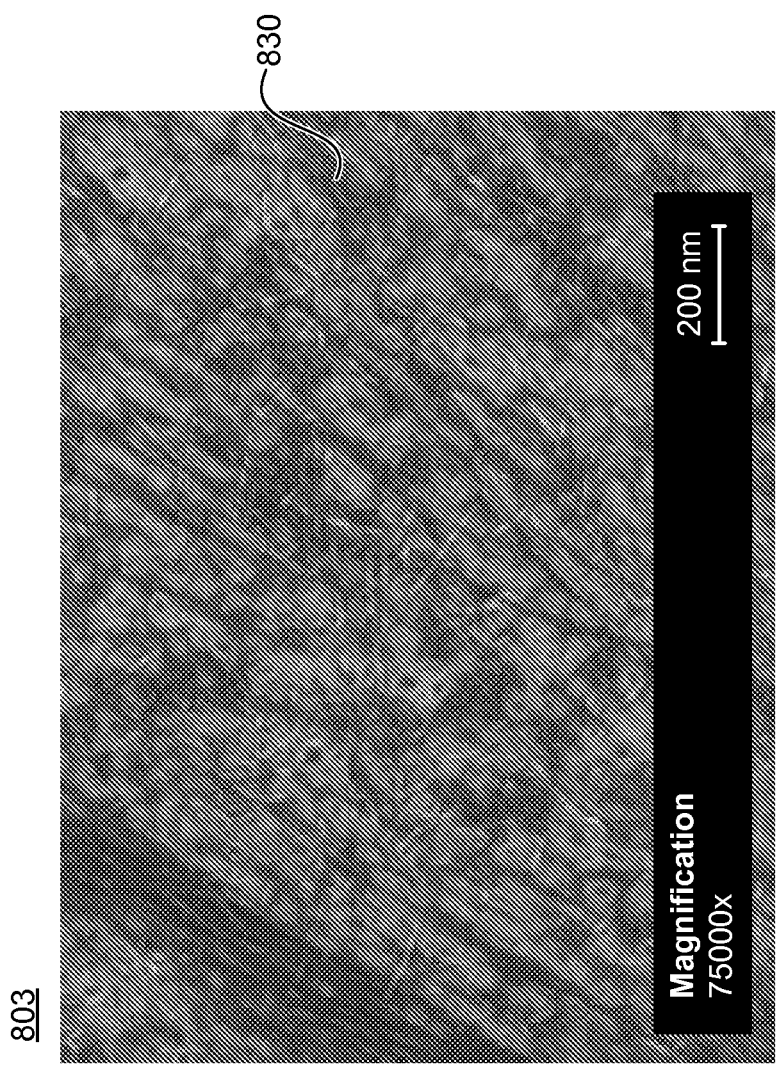

FIGS. 8A-8C are SEM images of an exemplary nanotube fabric layer at different magnifications (801, 802, and 803 respectively) prepared according to the methods of the present disclosure. The nanotube fabric layer depicted in FIGS. 8A-8C was rendered from an application solution with an optical density of 19.11 and an ammonium nitrate salt concentration of 16 ppm. These parameters resulted in a moderate amount of rafting within the nanotube fabric layer (801, 802, 803). Analysis of the entire nanotube fabric layer showed that approximately 11.6% of the fabric (by area) was comprised of rafted bundles of nanotube elements. These rafted bundles of nanotube elements are evident in FIG. 8A (810), FIG. 8B (820), and FIG. 8C (830).

Example 2

Figure 9A:
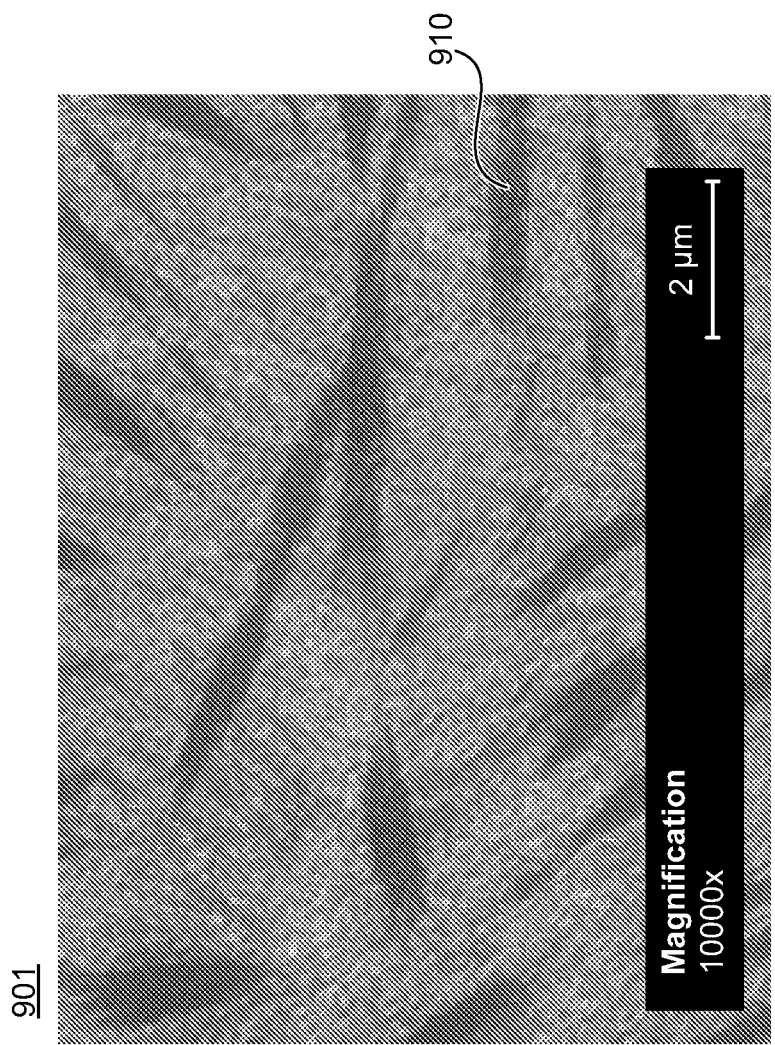
FIGS. 9A-9C are SEM images (at increasing magnifications) of an exemplary nanotube fabric layer formed according to the methods of the present disclosure which exhibits approximately 18.9% rafting.
Figure 9B:
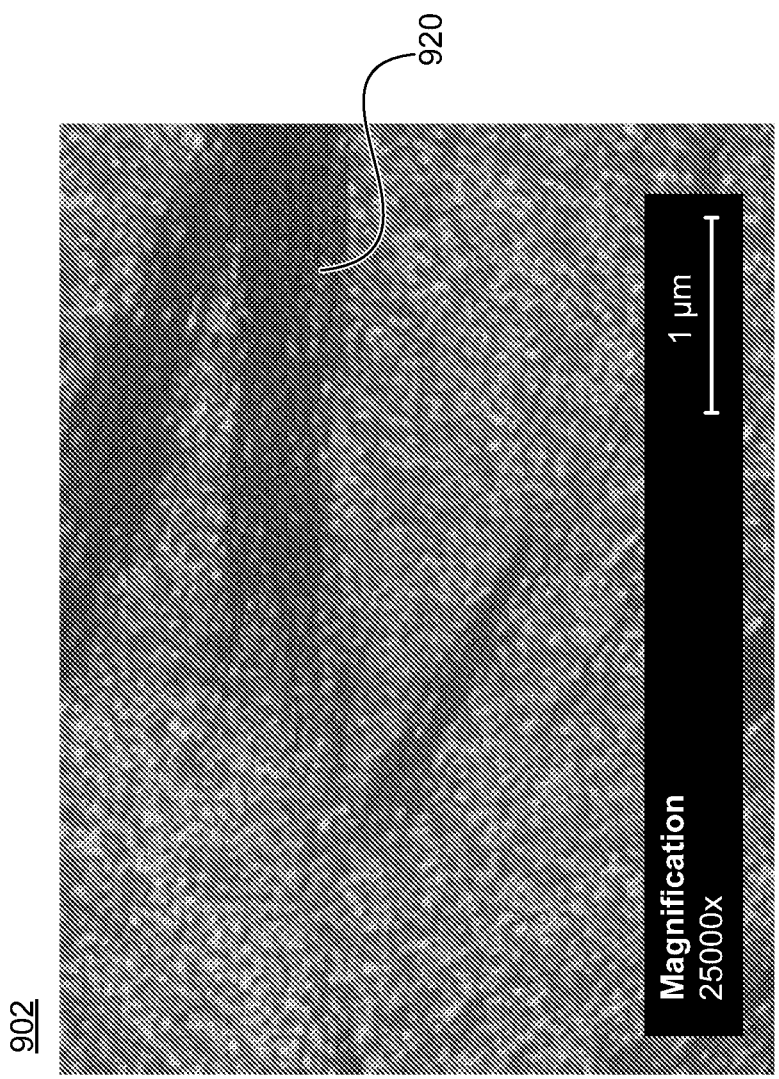
Figure 9C:
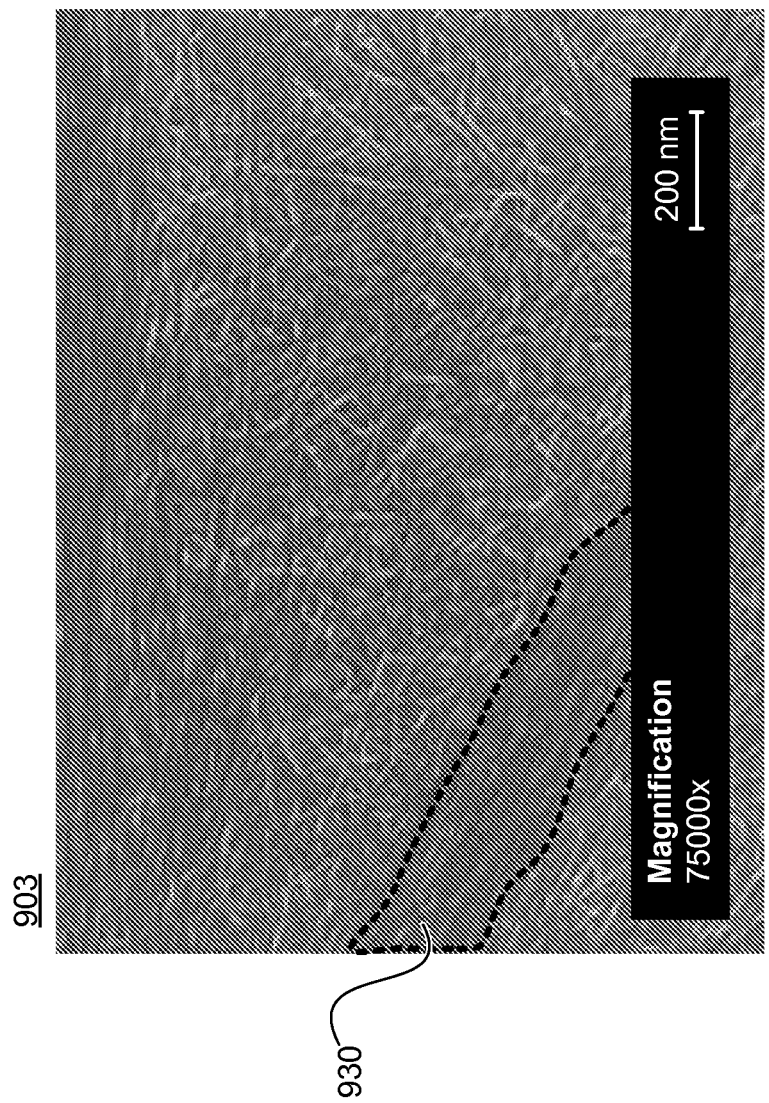

FIGS. 9A-9C are SEM images of an exemplary nanotube fabric layer at different magnifications (901, 902, and 903 respectively) prepared according to the methods of the present disclosure. The nanotube fabric layer depicted in FIGS. 9A-9C was rendered from an application solution with an optical density of 34.35 and an ammonium nitrate salt concentration of 12 ppm. These parameters resulted in a high degree of rafting within the nanotube fabric layer (901, 902, 903). Analysis of the entire nanotube fabric layer showed that approximately 18.9% of the fabric (by area) was comprised of rafted bundles of nanotube elements. These rafted bundles of nanotube elements are evident in FIG. 9A (910), FIG. 9B (920), and FIG. 9C (930).

Example 3

Figure 10A:
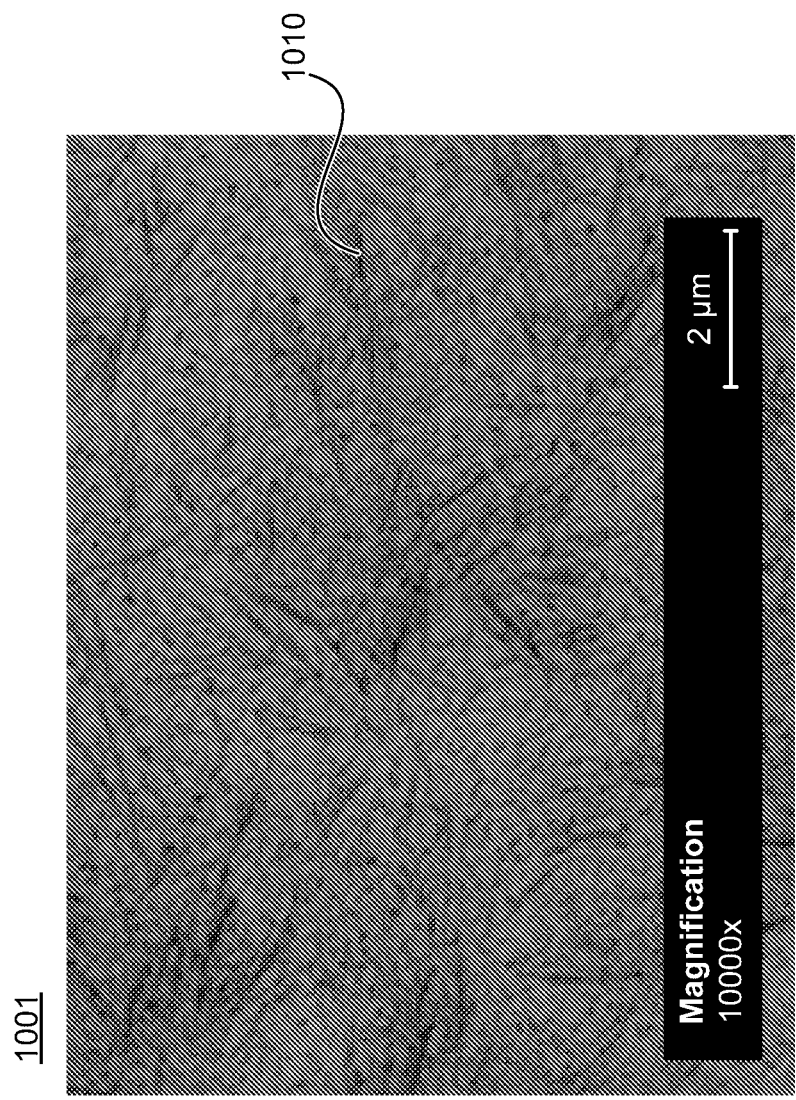
FIGS. 10A-10C are SEM images (at increasing magnifications) of an exemplary nanotube fabric layer formed according to the methods of the present disclosure which exhibits approximately 5.5% rafting.
Figure 10B:
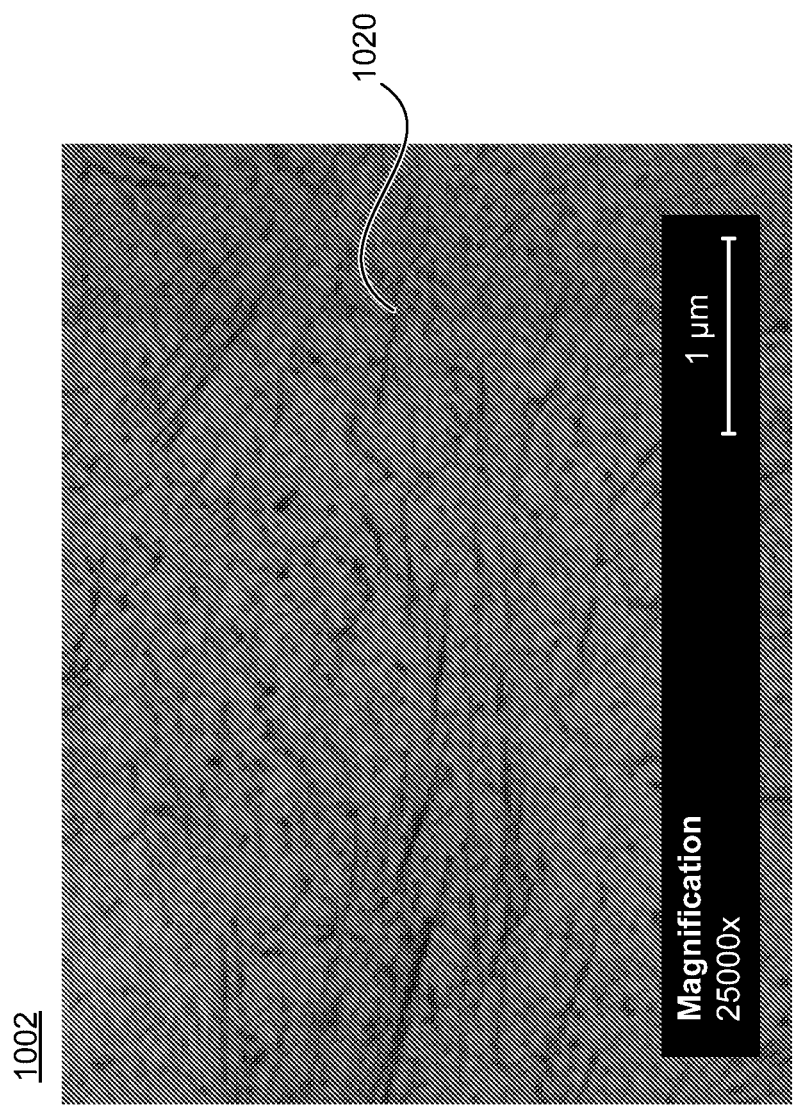
Figure 10C:
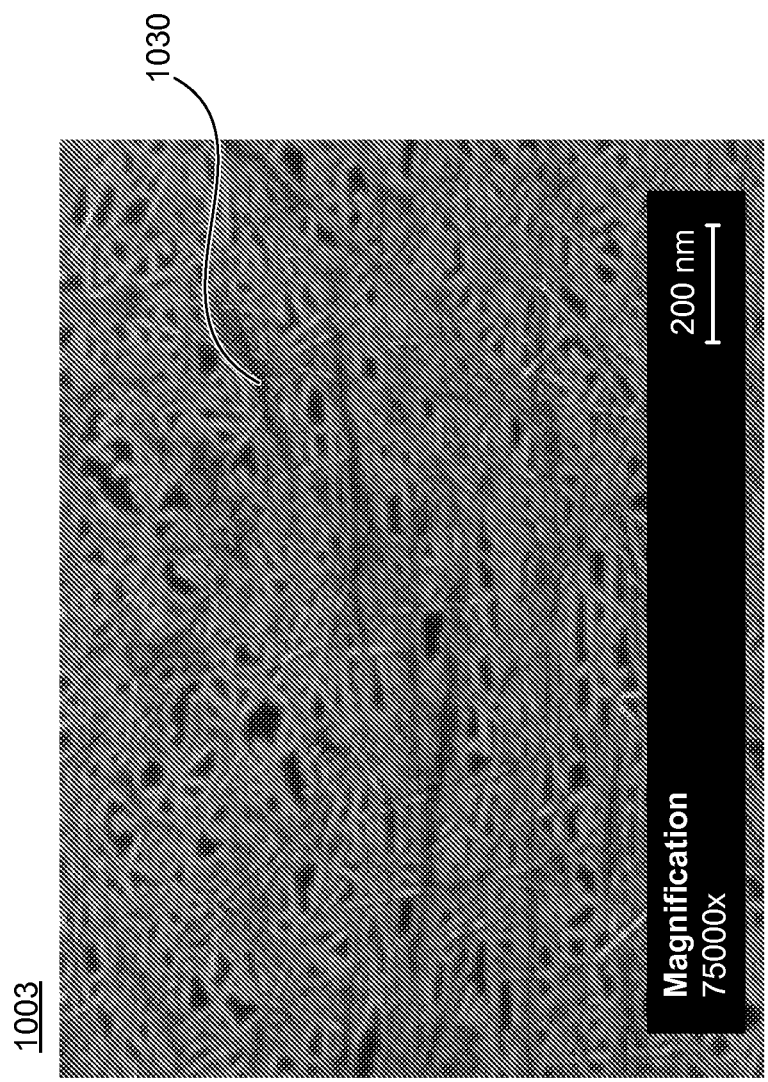

FIGS. 10A-10C are SEM images of an exemplary nanotube fabric layer at different magnifications (1001, 1002, and 1003 respectively) prepared according to the methods of the present disclosure. The nanotube fabric layer depicted in FIGS. 10A-10C was rendered from an application solution with an optical density of 10.02 and an ammonium nitrate salt concentration of 11 ppm. These parameters resulted in a low degree of rafting within the nanotube fabric layer (1001, 1002, 1003). Analysis of the entire nanotube fabric layer showed that approximately 5.5% of the fabric (by area) was comprised of rafted bundles of nanotube elements. These rafted bundles of nanotube elements are evident in FIG. 10A (1010), FIG. 10B (1020), and FIG. 10C (1030).

Example 4

Figure 11A:
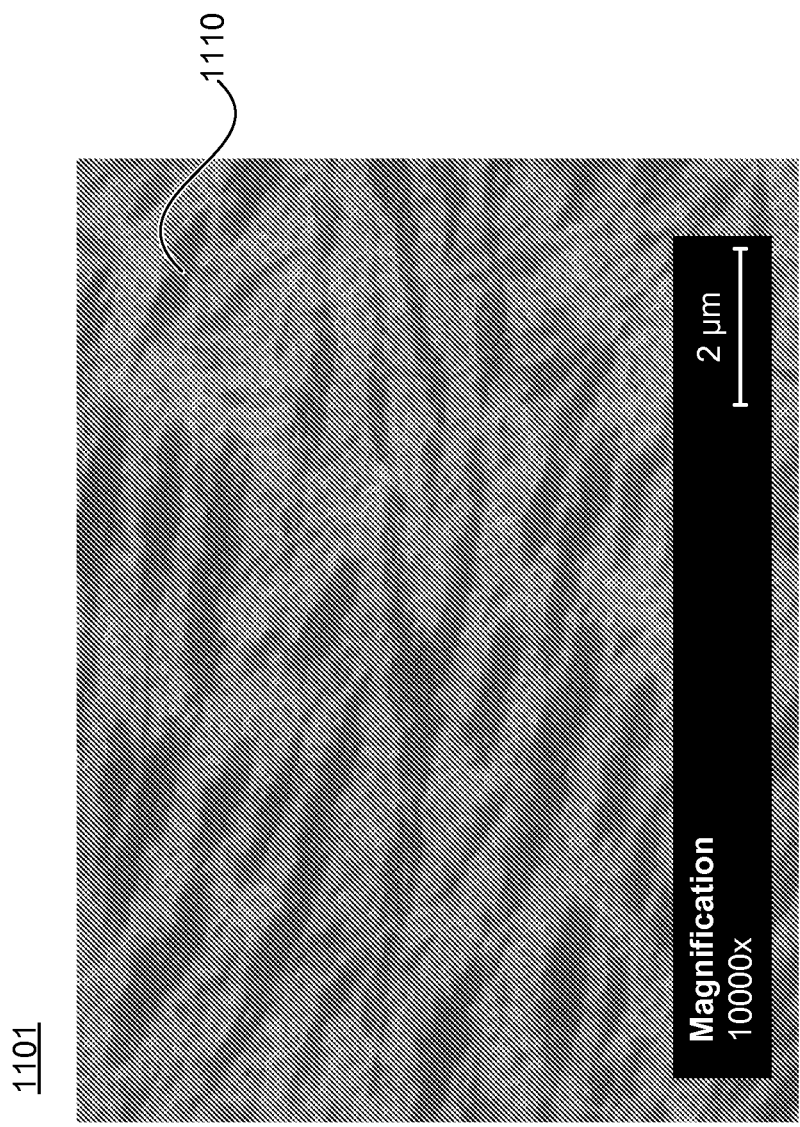
FIGS. 11A-11C are SEM images (at increasing magnifications) of an exemplary nanotube fabric layer formed according to the methods of the present disclosure which exhibits approximately 37.8% rafting.
Figure 11B:
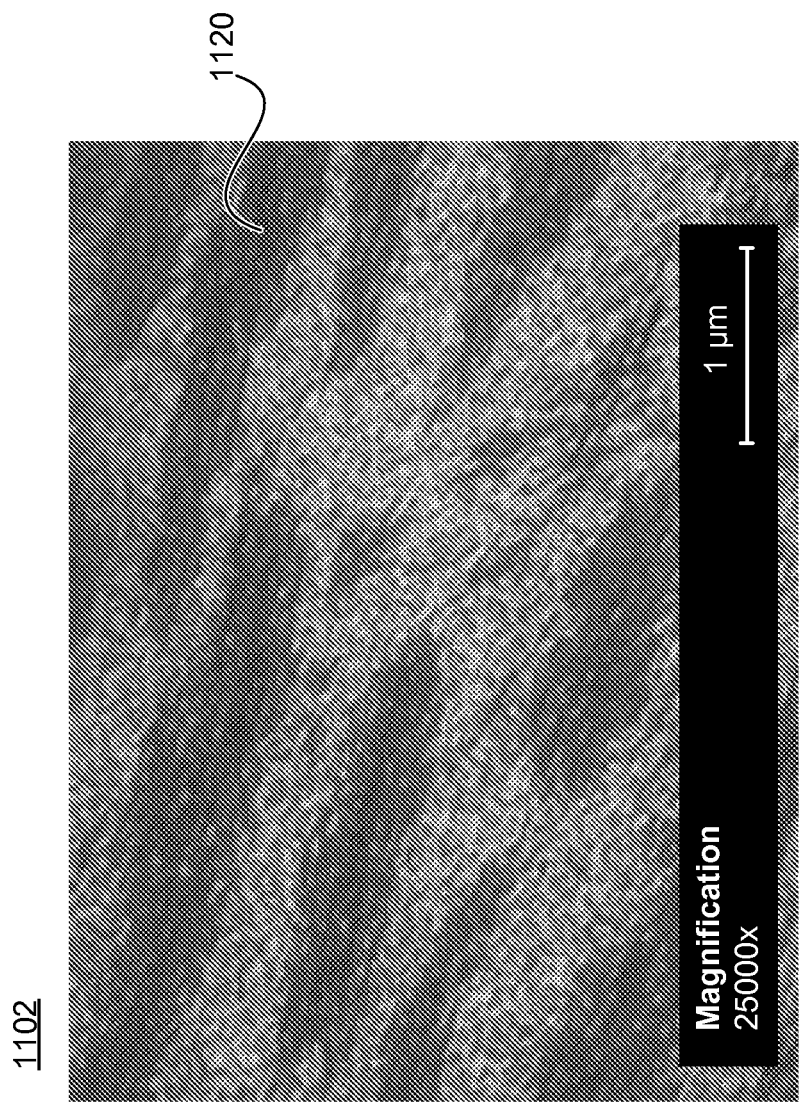
Figure 11C:
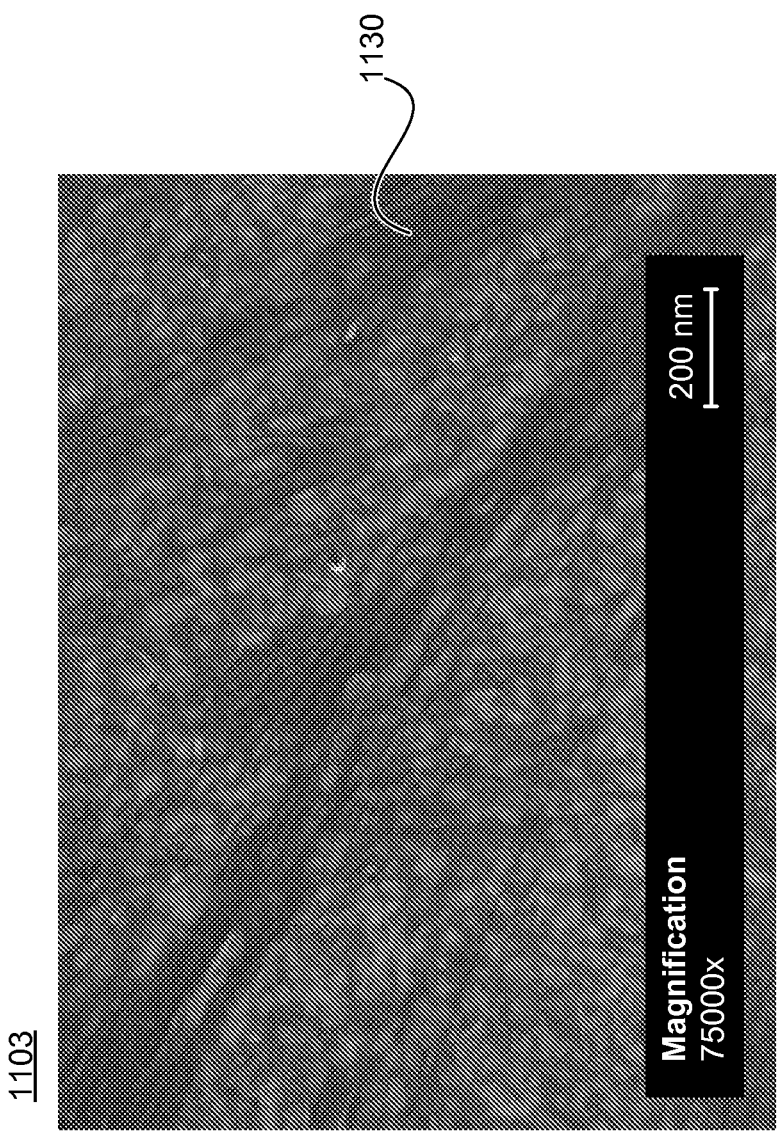

FIGS. 11A-11C are SEM images of an exemplary nanotube fabric layer at different magnifications (1101, 1102, and 1103 respectively) prepared according to the methods of the present disclosure. The nanotube fabric layer depicted in FIGS. 11A-11C was rendered from an application solution with an optical density of 19.69 and an ammonium nitrate salt concentration of 1.5 ppm. These parameters resulted in a high degree of rafting within the nanotube fabric layer (1101, 1102, 1103). Analysis of the entire nanotube fabric layer showed that approximately 37.8% of the fabric (by area) was comprised of rafted bundles of nanotube elements. These rafted bundles of nanotube elements are evident in FIG. 11A (1110), FIG. 11B (1120), and FIG. 11C (1130).

Example 5

Figure 12A:
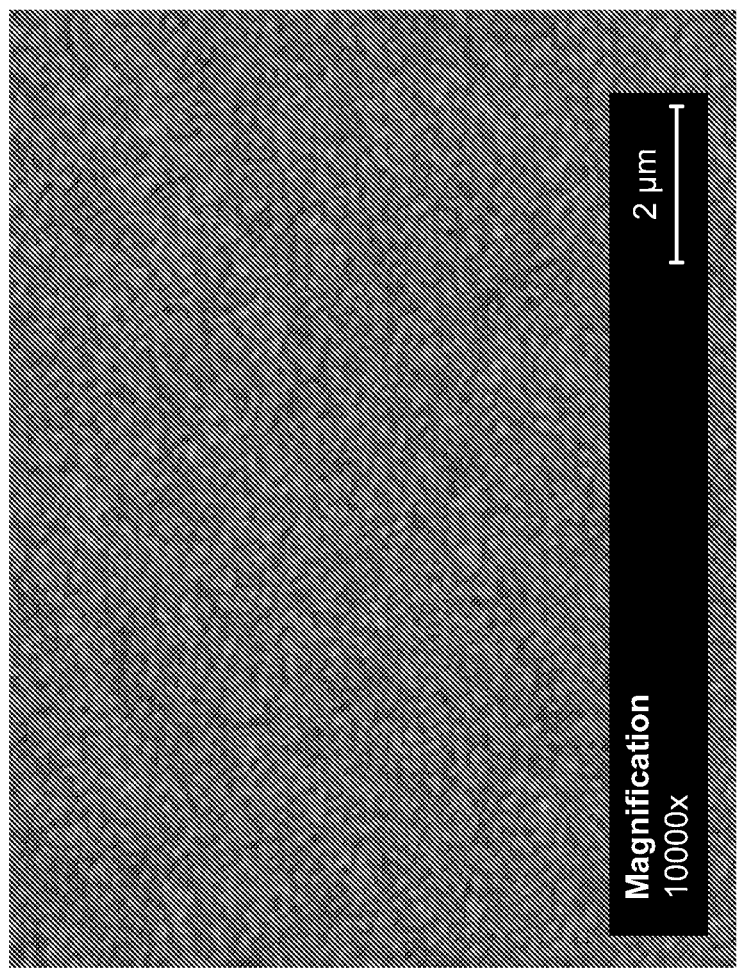
FIGS. 12A-12C are SEM images (at increasing magnifications) of an exemplary nanotube fabric layer formed according to the methods of the present disclosure which exhibits substantially no rafting.
Figure 12B:
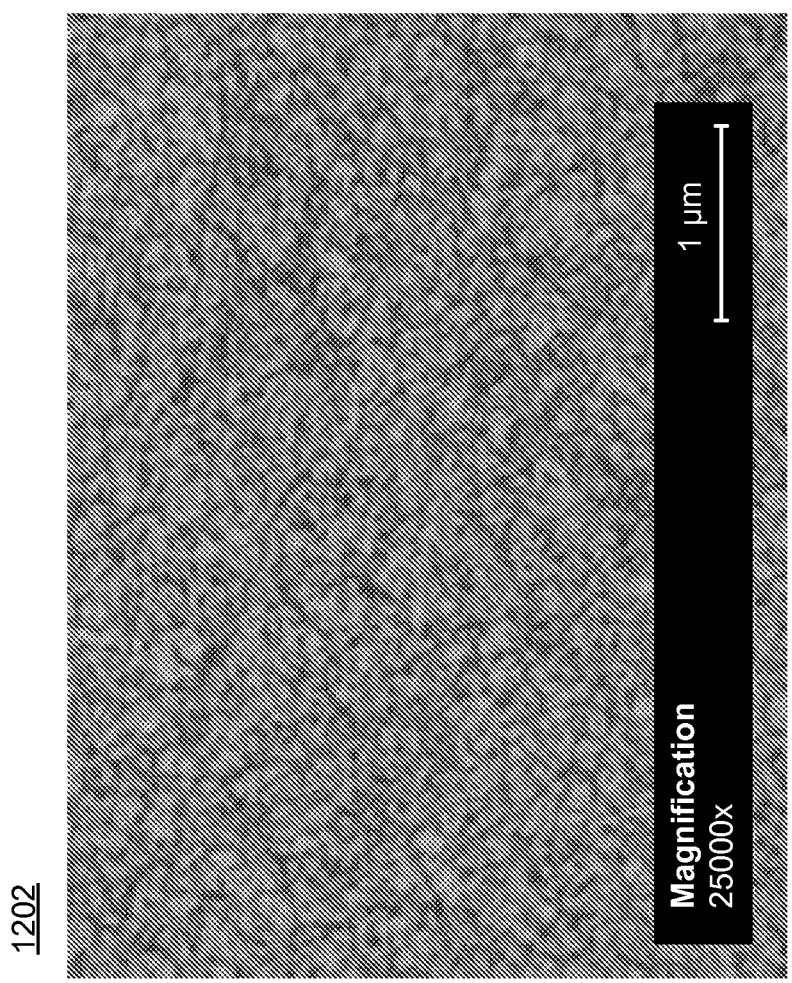
Figure 12C:
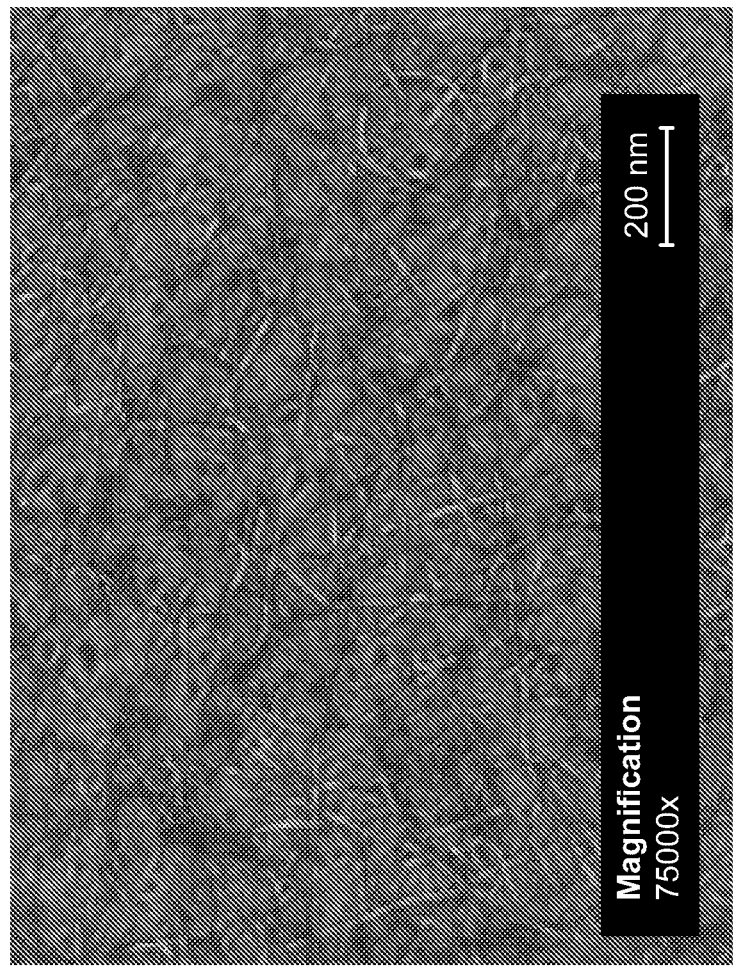

FIGS. 12A-12C are SEM images of an exemplary nanotube fabric layer at different magnifications (1201, 1202, and 1203 respectively) prepared according to the methods of the present disclosure. The nanotube fabric layer depicted in FIGS. 12A-12C was rendered from an application solution with an optical density of 19.71 and an ammonium nitrate salt concentration of 25 ppm. These parameters resulted in substantially no rafting within the nanotube fabric layer (1201, 1202, 1203). Analysis of the entire nanotube fabric layer showed that the fabric layer was substantially free of rafted bundles of nanotube elements.

Example 6

Figure 13A:
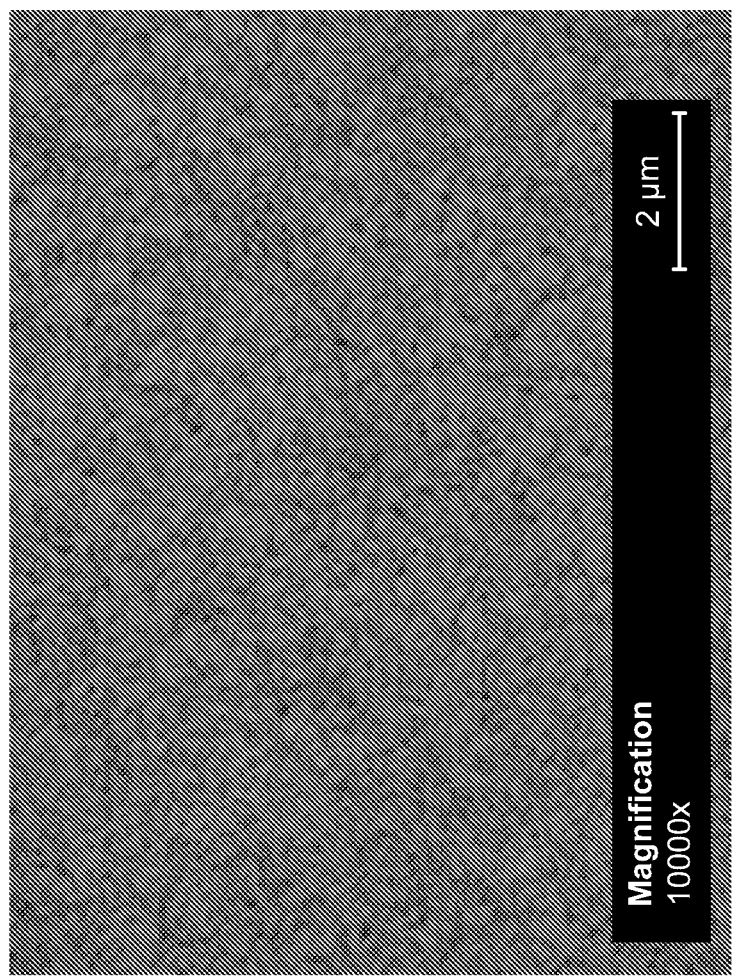
FIGS. 13A-13C are SEM images (at increasing magnifications) of an exemplary nanotube fabric layer formed according to the methods of the present disclosure which exhibits substantially no rafting.
Figure 13B:
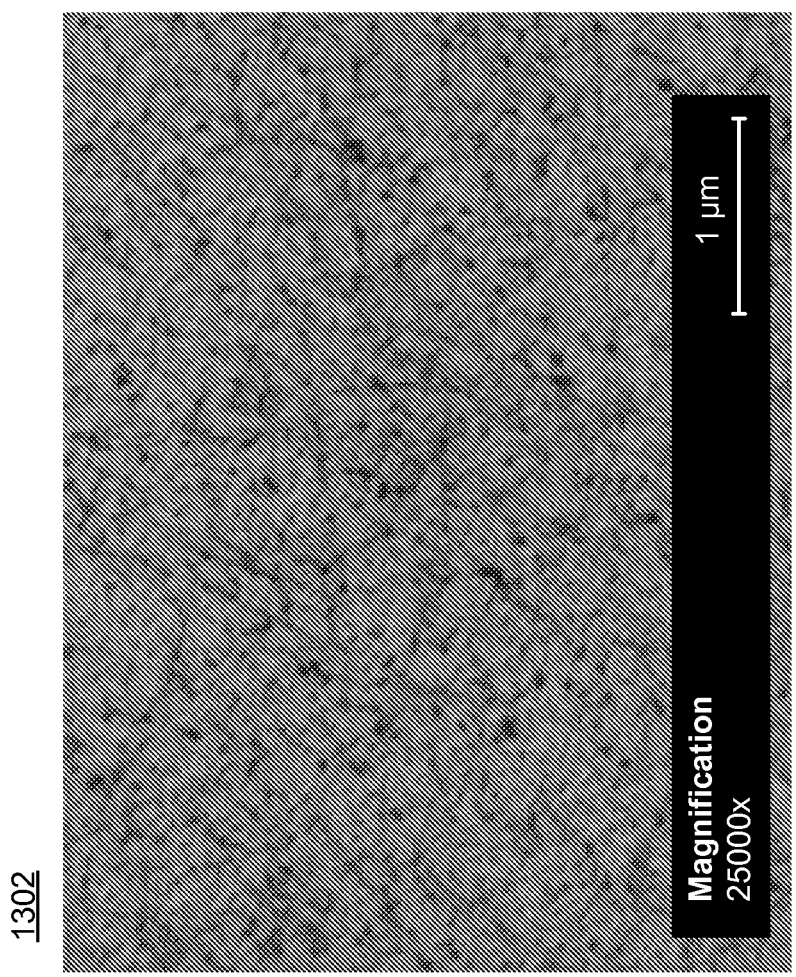
Figure 13C:
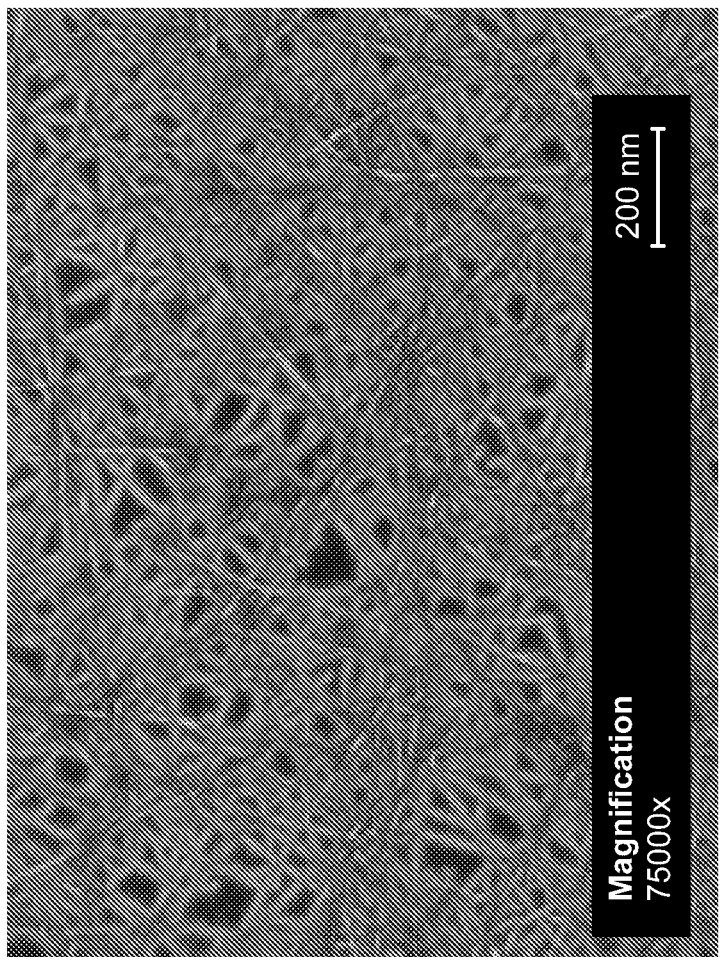

FIGS. 13A-13C are SEM images of an exemplary nanotube fabric layer at different magnifications (1301, 1302, and 1303 respectively) prepared according to the methods of the present disclosure. The nanotube fabric layer depicted in FIGS. 13A-13C was rendered from an application solution with an optical density of 10.02 and an ammonium nitrate salt concentration of 27 ppm. These parameters resulted in substantially no rafting within the nanotube fabric layer (1301, 1302, 1303). Analysis of the entire nanotube fabric layer showed that the fabric layer was substantially free of rafted bundles of nanotube elements.

Example 7

Figure 14A:
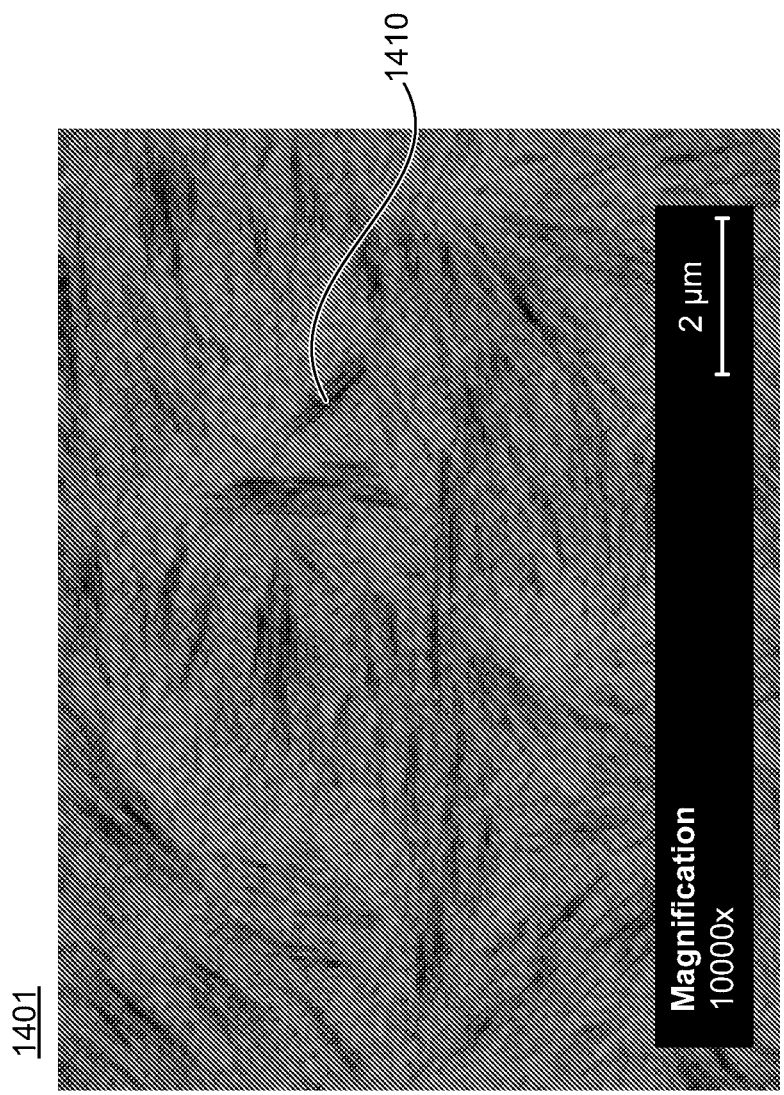
FIGS. 14A-14C are SEM images (at increasing magnifications) of an exemplary nanotube fabric layer formed according to the methods of the present disclosure which exhibits approximately 13.1% rafting.
Figure 14B:
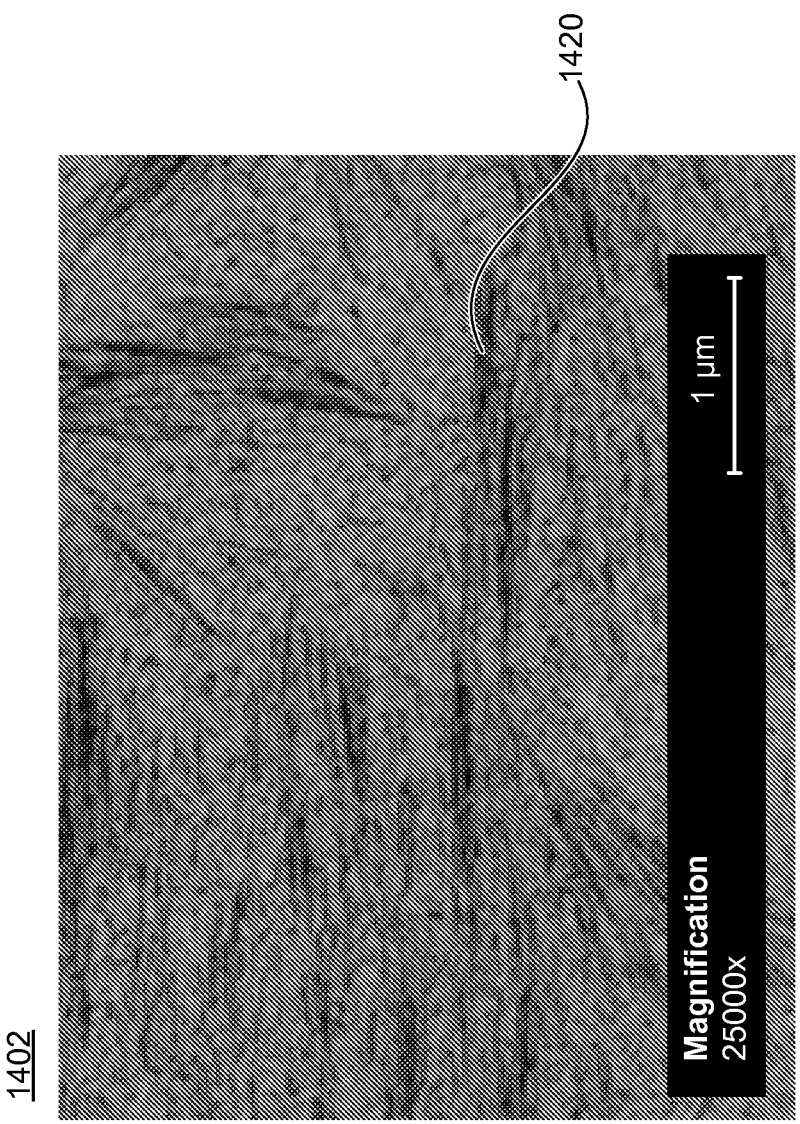
Figure 14C:
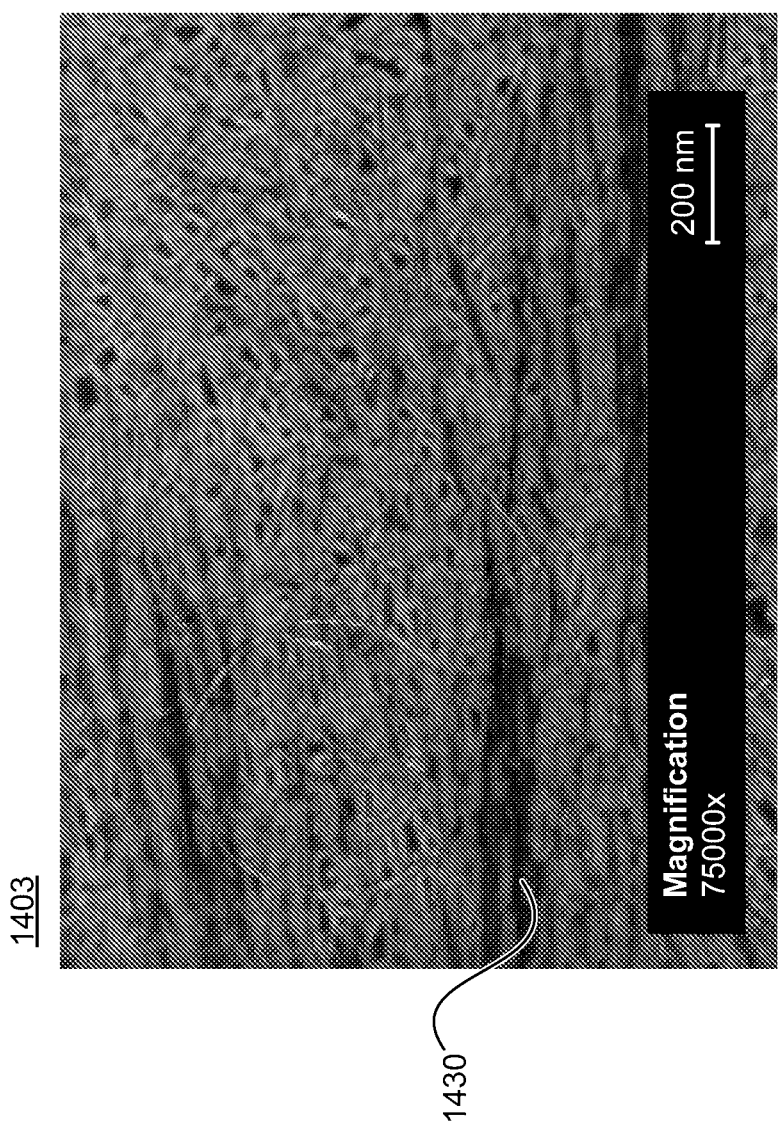

FIGS. 14A-14C are SEM images of an exemplary nanotube fabric layer at different magnifications (1401, 1402, and 1403 respectively) prepared according to the methods of the present disclosure. The nanotube fabric layer depicted in FIGS. 14A-14C was rendered from an application solution with an optical density of 9.4 and an ammonium nitrate salt concentration of 2.5 ppm. These parameters resulted in a moderate degree of rafting within the nanotube fabric layer (1401, 1402, 1403). Analysis of the entire nanotube fabric layer showed that approximately 13.1% of the fabric (by area) was comprised of rafted bundles of nanotube elements. These rafted bundles of nanotube elements are evident in FIG. 14A (1410), FIG. 14B (1420), and FIG. 14C (1430).

Example 8

Figure 15A:
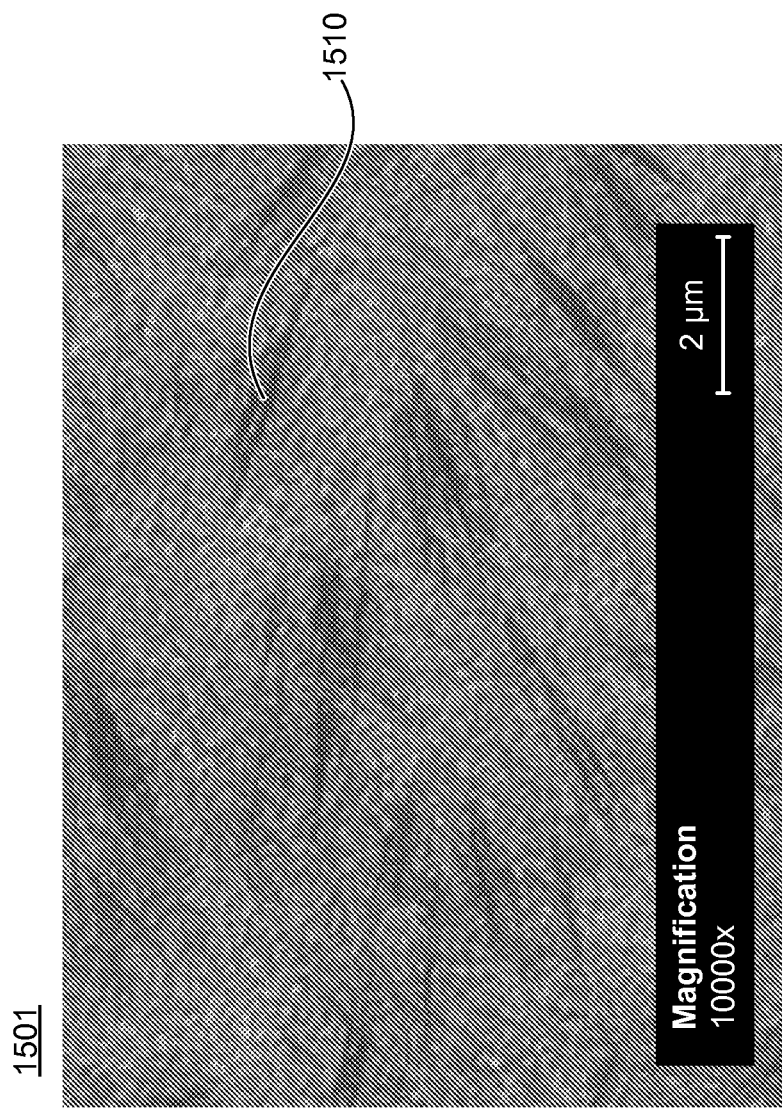
FIGS. 15A-15C are SEM images (at increasing magnifications) of an exemplary nanotube fabric layer formed according to the methods of the present disclosure which exhibits approximately 10.0% rafting.
Figure 15B:
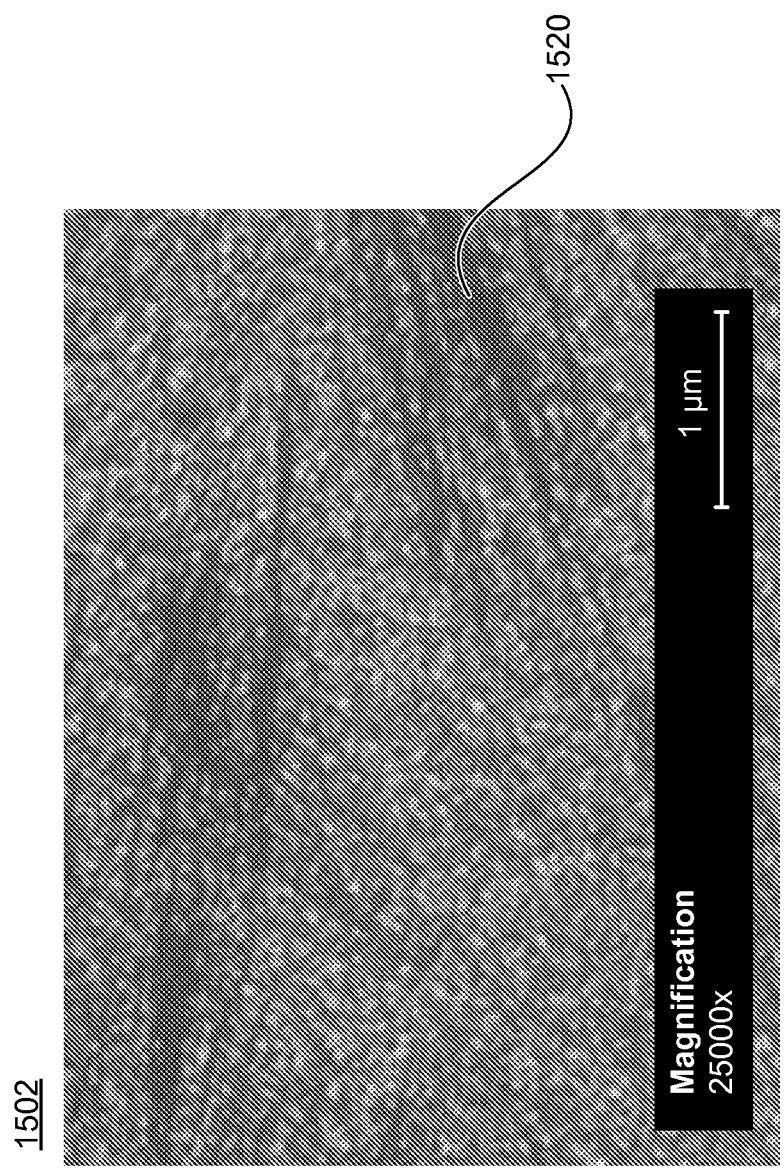
Figure 15C:
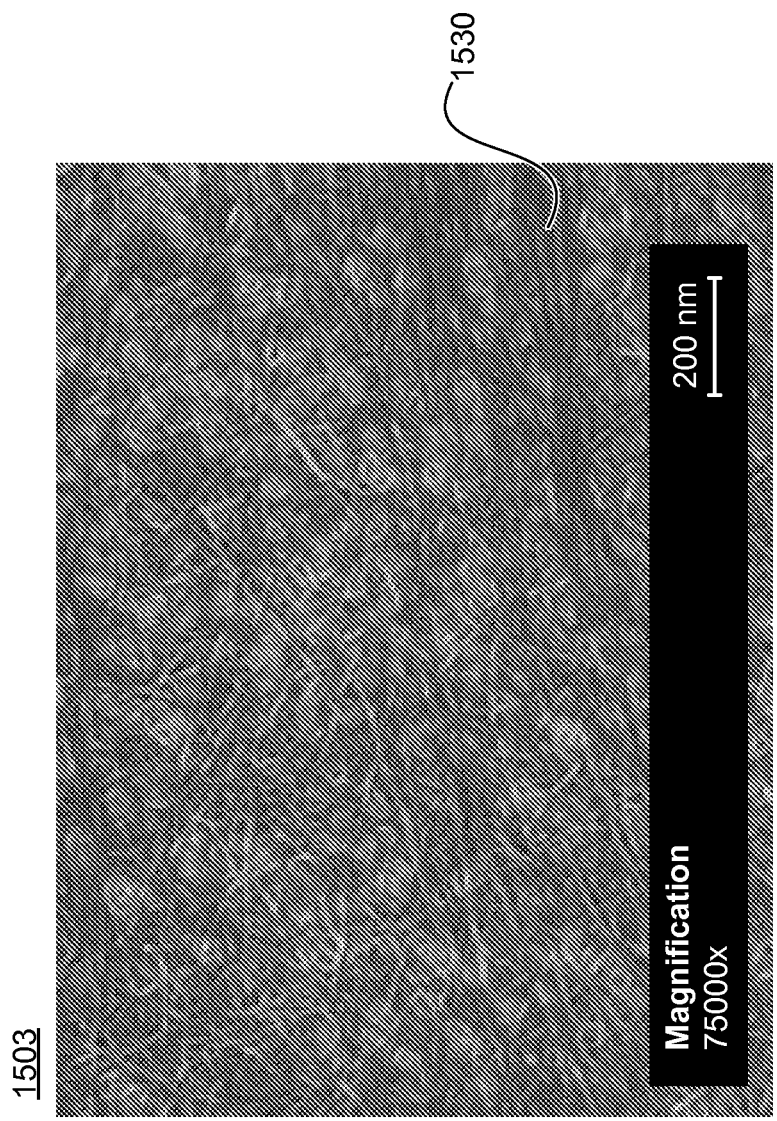

FIGS. 15A-15C are SEM images of an exemplary nanotube fabric layer at different magnifications (1501, 1502, and 1503 respectively) prepared according to the methods of the present disclosure. The nanotube fabric layer depicted in FIGS. 15A-15C was rendered from an application solution with an optical density of 33.9 and an ammonium nitrate salt concentration of 33 ppm. These parameters resulted in a moderate degree of rafting within the nanotube fabric layer (1501, 1502, 1503). Analysis of the entire nanotube fabric layer showed that approximately 10.0% of the fabric (by area) was comprised of rafted bundles of nanotube elements. These rafted bundles of nanotube elements are evident in FIG. 15A (1510), FIG. 15B (1520), and FIG. 15C (1530).

Example 9

Figure 16A:
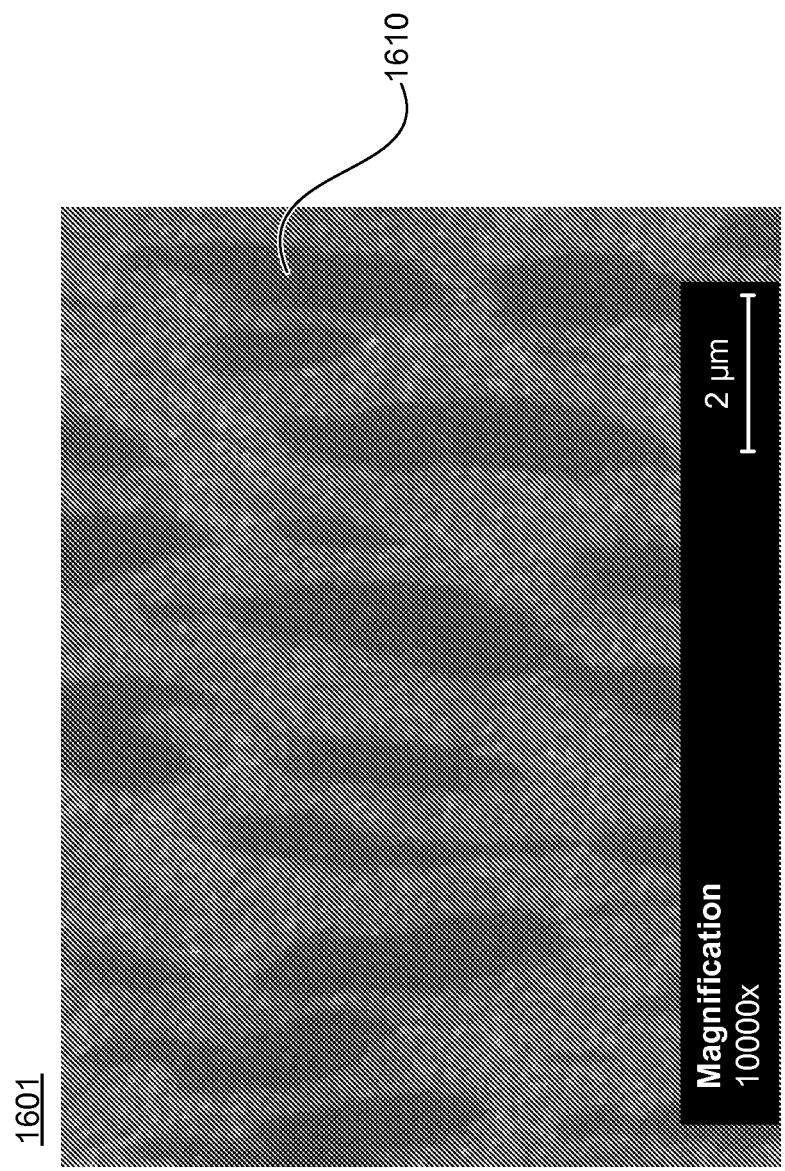
FIGS. 16A-16C are SEM images (at increasing magnifications) of an exemplary nanotube fabric layer formed according to the methods of the present disclosure which exhibits approximately 35.0% rafting.
Figure 16B:
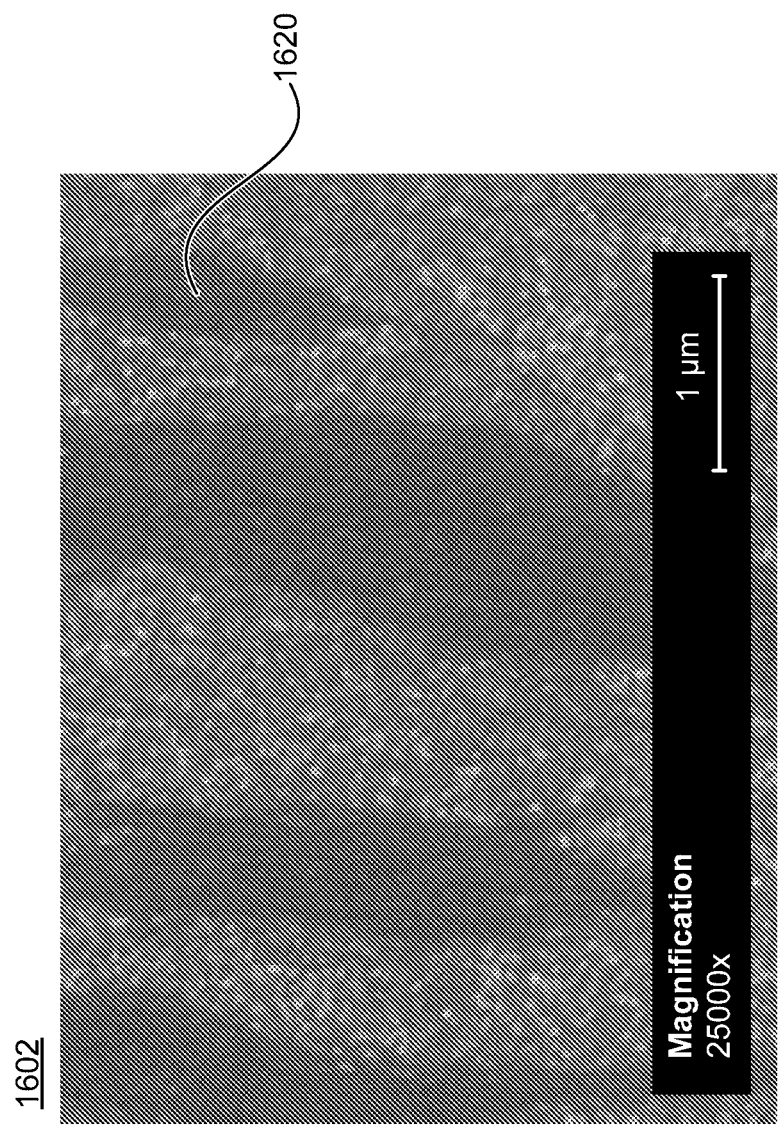
Figure 16C:
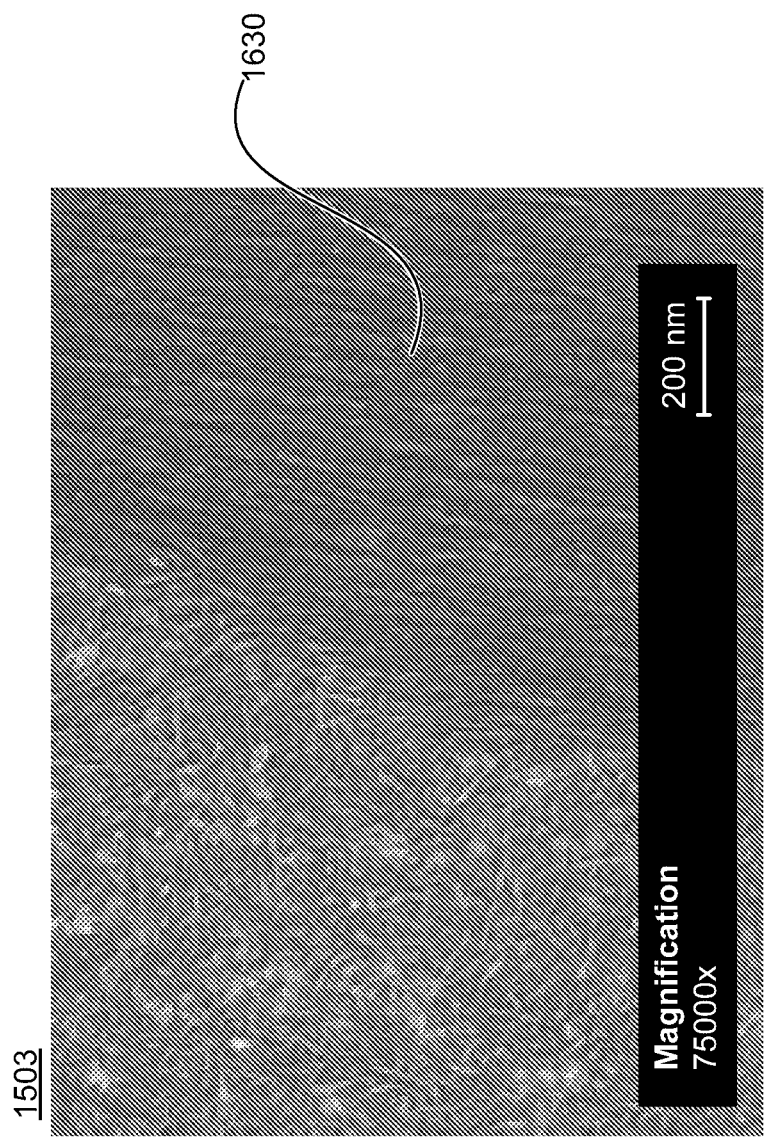

FIGS. 16A-16C are SEM images of an exemplary nanotube fabric layer at different magnifications (1601, 1602, and 1603 respectively) prepared according to the methods of the present disclosure. The nanotube fabric layer depicted in FIGS. 16A-16C was rendered from an application solution with an optical density of 33.9 and an ammonium nitrate salt concentration of 7.5 ppm. These parameters resulted in a high degree of rafting within the nanotube fabric layer (1601, 1602, 1603). Analysis of the entire nanotube fabric layer showed that approximately 35.0% of the fabric (by area) was comprised of rafted bundles of nanotube elements. These rafted bundles of nanotube elements are evident in FIG. 16A (1610), FIG. 16B (1620), and FIG. 16C (1630).

We have described multiple techniques to control the porosity and/or density of a nanotube fabric. The techniques also can be said to control the positioning of the nanotubes within the fabric, to control the positions of gaps within the nanotube fabric, and to control the concentration of the nanotubes within the fabric. For example, these techniques can provide low porosity, high density fabrics. Further, the techniques can be described as controlling the gaps of nanotubes within the nanotube fabric. Thus, we have disclosed techniques to create devices sized to and smaller than the current lithography limits (for example, less than or equal to about 20 nm). Low porosity, high density fabrics also can be created by, for example, filling gaps in the nanotube film with additional nanotube elements. In other embodiments, a high density fabric can be created by applying a physical force to the fabric. Further, the density or porosity of the fabric can be controlled to create low density and highly porous nanotube fabrics, if so desired.

Further, the methods of the present disclosure are useful for any application using nanotube fabrics wherein the concentration of the individual nanotube elements within the fabric or the dimensions of gaps within the fabric are required to fit within a preselected tolerance.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of preparing a nanotube application solution, comprising:
    forming a nanotube application solution, said nanotube application solution comprising a first plurality of nanotube elements at a first concentration level and a second plurality of ionic particles at a second concentration level dispersed in a liquid medium; and
    reducing said second concentration level of said second plurality of ionic particles such as to promote rafting within a nanotube fabric layer formed using said nanotube application solution;
    wherein said second plurality of ionic particles is selected from the group consisting of ammonium salts, nitrate salts, and ammonium nitrate salts or mixtures thereof.

2. The method of claim 1 wherein said first plurality of nanotube elements are carbon nanotubes.

3. The method of claim 2 wherein said carbon nanotubes are single walled carbon nanotubes.

4. The method of claim 2 wherein said carbon nanotubes are multi walled carbon nanotubes.

5. The method of claim 1 wherein said liquid medium is an aqueous solution.

6. The method of claim 1 wherein said first concentration level of said first plurality of nanotube elements is increased.

7. The method of claim 6 wherein said first concentration level of said first plurality of nanotube elements is increased by introducing an additional volume of said liquid medium into said nanotube application solution.

8. The method of claim 1 wherein said second concentration level of said second plurality of ionic particles is decreased through a filtration process.

9. The method of claim 8 wherein said filtration process is one of a cross flow filtration process, a sonication filtration process, and a centrifugation filtration process.

10. The method of claim 1 wherein reducing said second concentration level of said second plurality of ionic particles promotes rafting by promoting at least one of van der Waals interactions and $\pi$-$\pi$ interactions between nanotube elements.

11. The method of claim 1 wherein said second concentration level is reduced below 10 ppm.

12. The method of claim 1 wherein said nanotube elements are functionalized nanotubes.

13. The method of claim 1 wherein said liquid medium has a pH between 4 and 10.

* * * * *